United States Patent [19]

Shibuya et al.

[11] Patent Number: 5,719,533
[45] Date of Patent: Feb. 17, 1998

[54] FUNCTION GENERATOR

[75] Inventors: Shuji Shibuya; Hisato Takeuchi; Makoto Eguchi; Takaharu Saeki, all of Kanagawa, Japan

[73] Assignee: Matsushita Electric Industrial Co., Ltd., Osaka, Japan

[21] Appl. No.: 721,291

[22] Filed: Sep. 26, 1996

[30] Foreign Application Priority Data

Sep. 27, 1995 [JP] Japan .................................. 7-249046

[51] Int. Cl.$^6$ .................................. H03B 5/04; H03B 5/32; H03K 3/011
[52] U.S. Cl. .......................... 331/176; 331/158; 310/315; 327/512; 327/513
[58] Field of Search .................... 331/116 R, 116 FE, 331/158, 176; 327/572, 573; 310/315

[56] References Cited

U.S. PATENT DOCUMENTS

| | | | |
|---|---|---|---|
| 4,978,930 | 12/1990 | Suter | 331/176 |
| 5,422,832 | 6/1995 | Moyal | 327/512 X |
| 5,434,533 | 7/1995 | Furutani | 327/513 X |
| 5,546,041 | 8/1996 | Szajda | 327/512 |

OTHER PUBLICATIONS

Hidehiko Aoki, "An Introduction to Functional Circuit Design of Analog IC", CQ Publishing CO., Ltd, pp. 187–200, 1992.

*Primary Examiner*—David Mis
*Attorney, Agent, or Firm*—McDermott, Will & Emery

[57] ABSTRACT

In order to realize highly accurate temperature compensation of a crystal oscillation frequency, a current in proportion to the cube of a difference between an ambient temperature $T_a$ and a reference temperature $T_0$ is generated. For this purpose, provided are a first series circuit of two diodes; a second series circuit of three diodes; a third series circuit of two diodes; a fourth series circuit of three diodes; a current source for allowing a constant current to flow into the first series circuit; a current source for allowing a constant current to flow from the third series circuit; a current source for allowing a current in proportion to $T_a-T_0$ to flow into the second series circuit when $T_a \geq T_0$ and allowing a current in proportion to $|T_a-T_0|$ to flow from the fourth series circuit when $T_a < T_0$; an NPN transistor and a PNP transistor whose collectors are connected with an output terminal; and two operational amplifiers for applying a voltage between the anode terminals of the first and second series circuits between the base and the emitter of the NPN transistor and for applying a voltage between the cathode terminals of the third and fourth series circuits between the base and the emitter of the PNP transistor, respectively.

16 Claims, 17 Drawing Sheets

FUNCTION GENERATOR

BACKGROUND OF THE INVENTION

The present invention relates to a function generator suitable for temperature compensation of crystal oscillation frequency.

Various electric equipment are required not only to be compact and light but also have a high reliability and high accuracy these days. In such a background, a crystal resonator is widely used for generating a clock signal or the like in a large number of electric equipment. Accordingly, the oscillation frequency of a crystal oscillator using a crystal resonator is also required to be highly stable, and in particular, the oscillation frequency is desired to be highly stable against variation of the ambient temperature. An AT-cut quartz resonator is now the most commonly utilized as the crystal resonator.

It is known that the oscillation frequency of a crystal oscillator using an AT-cut quartz resonator is largely varied in a manner substantially represented by a cubic function in accordance with the variation of the ambient temperature $T_a$ when the temperature is not compensated. For example, the proportion of an oscillation frequency f (at the ambient temperature $T_a$) to a reference frequency $f_0$ (at a reference temperature $T_0$; the room temperature) is varied by several tens accordance with the variation of the ambient temperature $T_a$ppm at the ambient temperature $T_a$ ranging between $-30°$ C. and $+80°$ C. Also, the reference frequency $f_0$ is fluctuated. Such variation and fluctuation of the oscillation frequency can be a significant problem in electric equipment with high accuracy. Accordingly, there is a demand for a crystal oscillator with a more stable oscillation frequency. For example, it is necessary to suppress the variation in the frequency proportion $f/f_0$ to 2.5 ppm or less and the fluctuation of the reference frequency $f_0$ to 0.3 ppm or less.

In the electric equipment with high accuracy, therefore, the temperature compensation for the crystal oscillation frequency is generally effected. For example, the crystal resonator is connected with a variable capacitance diode in series, and a compensation voltage in accordance with the ambient temperature $T_a$ is applied to the variable capacitance diode. A compensation voltage $V_{in}$ for making constant the oscillation frequency f regardless of the ambient temperature $T_a$ is obtained as follows:

$$V_{in} = -A(T_a - T_0)^3 + B(T_a - T_0) + C \quad (1)$$

wherein A, B and C are constants excluding 0 (zero). In other words, the compensation voltage $V_{in}$ of Formula (1) is represented by a cubic function of a difference between the ambient temperature $T_a$ and the reference temperature $T_0$. The cubic curve corresponding to this cubic function is a point-symmetrical curve with a point of inflection at the point where $T_a = T_0$.

In a conventional technique, discrete compensation voltage data at respective temperatures are previously stored in a programmable ROM, and a data corresponding to the ambient temperature $T_a$ detected by a temperature sensor is read from the programmable ROM. The read data is converted into an analog signal by a D/A converter, so that a compensation voltage $V_{in}$ in accordance with the analog signal is applied to the variable capacitance diode. However, in adopting this technique, there arises a problem that a quantize noise peculiar to the digital system occurs in the compensation voltage $V_{in}$ and appears in the oscillation frequency f as a phase noise. In addition, the conventional technique is disadvantageous also because it is necessary to use a programmable ROM with a large capacity and a D/A converter with a high resolution in order to improve the accuracy in the temperature compensation.

SUMMARY OF THE INVENTION

The object of this invention is providing a function generator which can realize highly accurate temperature compensation of a crystal oscillation frequency without using a programmable ROM with a large capacity and a D/A converter with a high resolution.

For achieving this object, the function generator of this invention for generating a current in proportion to the power of a difference between the ambient temperature and a reference temperature comprises a plurality of diode series and a plurality of current sources for allowing currents to flow through the respective diode series. Specifically, the function generator of this invention comprises a first diode series including a first series circuit of a first number of diodes, a voltage at a first terminal of the first series circuit being fixed at a reference voltage; a first current source connected with a second terminal of the first series circuit so that a constant current unaffected by the ambient temperature flows to the first diode series; a second diode series including a second series circuit of a second number, which is larger than the first number, of diodes, a voltage at a first terminal of the second series circuit being fixed at the reference voltage; a second current source connected with a second terminal of the second series circuit so that a current in proportion to the difference between the ambient temperature and the reference temperature flows to the second diode series; an output terminal for outputting a current; an output transistor whose collector is connected with the output terminal; and voltage applying means for applying a differential voltage of a voltage at the second terminal of the first series circuit and a voltage at the second terminal of the second series circuit between the base and the emitter of the output transistor.

According to the function generator of this invention, for example, when the number of the diodes included in the first series circuit is set at two and the number of the diodes included in the second series circuit is set at three, an output current in proportion to the cube of the difference between the ambient temperature and the reference temperature can be generated. When the output transistor is an NPN transistor, a current can be absorbed by the collector of the NPN transistor through the output terminal, and when the output transistor is a PNP transistor, a current can be discharged from the collector of the PNP transistor through the output terminal. Accordingly, complimentary combination of such transistors provides a cubic function generator in which, for example, a current in proportion to the cube of the difference between the ambient temperature and the reference temperature can be absorbed through the output terminal when the ambient temperature is equal to or higher than the reference temperature, and a current in proportion to the cube of the difference between the ambient temperature and the reference temperature can be discharged through the output terminal when the ambient temperature is lower than the reference temperature. Furthermore, by utilizing this cubic function generator, it is possible to realize a temperature compensation circuit of the analog system for use in a crystal oscillator for generating a compensation voltage represented by Formula (1).

DETAILED DESCRIPTION OF THE INVENTION

The function generator of the present invention will now be described by way of examples referring to the accompanying drawings.

Figure 1:
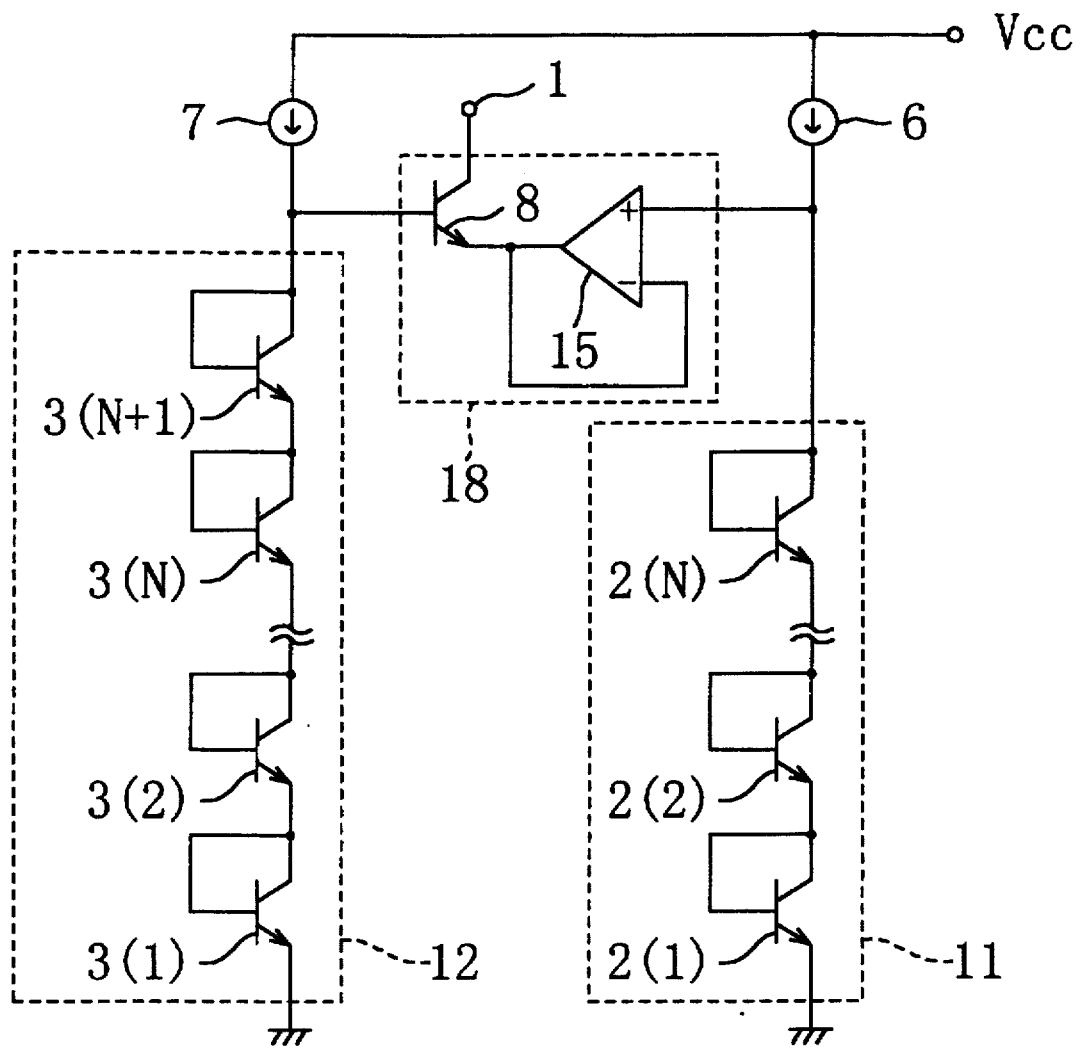
FIG. 1 is a circuit diagram for showing an example of the configuration of a function generator of this invention.

FIG. 1 shows an exemplified configuration of the function generator of this invention. The function generator of FIG. 1 comprises a diode series 11 of N diodes 2 in series, each of which is composed of an NPN transistor with its base connected with its own collector, and a diode series 12 of N+1 diodes 3 in series, each of which is composed of an NPN transistor with its base connected with its own collector, wherein N is one or a larger integer. The voltage at the cathode terminal of each of the diode series 11 and 12 is fixed at a ground voltage. The function generator of FIG. 1 further comprises a current source 6 for discharging a current to the anode terminal of the diode series 11 so that a constant current can flow into the diode series 11 regardless of the ambient temperature, a current source 7 for discharging a current to the anode terminal of the diode series 12 so that a current in proportion to a difference between the ambient temperature and a reference temperature can flow into the diode series 12, an output terminal 1 for outputting a current, and an output circuit 18 for absorbing a current through the output terminal 1. The current sources 6 and 7 are supplied with a supply voltage $V_{cc}$. The output circuit 18 includes an output NPN transistor 8 and an operational amplifier 15. The collector of the output NPN transistor 8 is connected with the output terminal 1 and the base thereof is connected with the anode terminal of the diode series 12. The operational amplifier 15 works as a voltage follower so that a voltage equal to that at the anode terminal of the diode series 11 can be supplied to the emitter of the output NPN transistor 8. Accordingly, a differential voltage of the voltage at the anode terminal of the diode series 12 and the voltage at the anode terminal of the diode series 11 is applied between the base and the emitter of the output NPN transistor 8.

In the function generator of FIG. 1, a current flowing from the current source 6 is indicated as $I_0$, a current flowing from the current source 7 is indicated as $I_T$, the voltage at the anode terminal of the diode series 11 is indicated as $V_1$ and the voltage at the anode terminal of the diode series 12 is indicated as $V_2$. Also, the saturation current of the respective diodes and transistors is indicated as $I_S$. In this case, the respective voltages can be obtained by the following formulas:

$$V_1 = NV_T \ln(I_0/I_S) \quad (2)$$

$$V_2 = (N+1)V_T \ln(I_T/I_S) \quad (3)$$

$$V_T = kT_a/q \quad (4)$$

wherein k indicates the Boltzmann's constant and q indicates the charge amount of an electron. When the collector current of the output NPN transistor 8 is indicated as I, the current I is represented as follows:

$$I = I_S \exp\{(V_2 - V_1)/V_T\} \quad (5)$$

On the basis of Formulas (2), (3) and (5), the following formula can be obtained:

$$I = I_0 (I_T/I_0)^{N+1} \quad (6)$$

At this point, it is assumed that when $T_a \geq T_0$, the following formula holds:

$$I_T = \{(T_a - T_0)/T_0\} I_0 \quad (7)$$

and that when $T_a < T_0$, the following formula holds:

$$I_T = 0 \quad (8)$$

Specifically, when the ambient temperature $T_a$ is equal to or lower than the reference temperature $T_0$, the current source 7 cuts the current flow to the diode series 12, and when the ambient temperature $T_a$ is higher than the reference temperature $T_0$, the current source 7 supplies the current $I_T$ which increases as the ambient temperature $T_a$ increases (namely, a current in proportion to $T_a - T_0$) to the diode series 12. In this case, on the basis of Formulas (6) and (7), when $T_a \geq T_0$, the following formula holds:

$$I = I_0 \{(T_a - T_0)/T_0\}^{N+1} \quad (9)$$

Accordingly, the current I absorbed by the collector of the output NPN transistor 8 through the output terminal 1 is in proportion to the power of $T_a - T_0$. For example, when N=2, the current I is in proportion to the cube of $T_a - T_0$, Also, in the function generator of FIG. 1, it is assumed that when $T_a \geq T_0$, the following formula holds:

$$I_T = 0 \tag{10}$$

and that when $T_a < T_0$, the following formula holds:

$$I_T = \{|T_a - T_0|\}I_0 \tag{11}$$

In this case, when $T_a < T_0$, the following relationship holds:

$$I = I_0\{|T_a - T_0|/T_0\}^{N+1} \tag{12}$$

In this manner, in the function generator of FIG. 1, a current in proportion to the power of a difference between the ambient temperature $T_a$ and the reference temperature $T_0$ can be absorbed through the output terminal 1.

Figure 2:
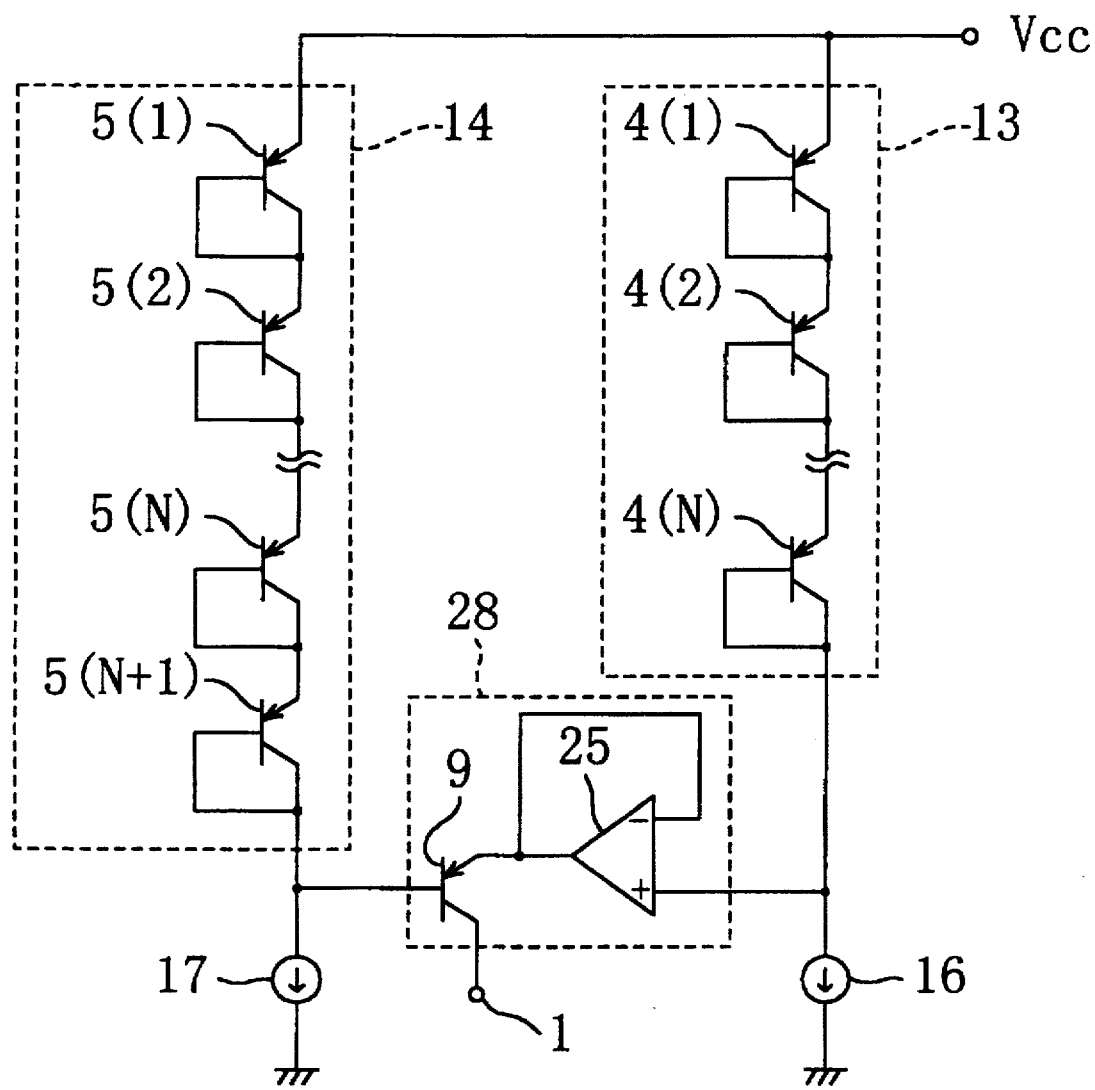
FIG. 2 is a circuit diagram for showing another example of the configuration of the function generator of this invention.

FIG. 2 shows another exemplified configuration of the function generator of this invention. The function generator of FIG. 2 comprises a diode series 13 of N diodes 4 in series, each of which is composed of a PNP transistor with its base connected with its own collector, and a diode series 14 of N+1 diodes 5 in series, each of which is composed of a PNP transistor with its base connected with its own collector. The voltage at the anode terminal of each of each of the diode series 13 and 14 is fixed at a supply voltage $V_{cc}$. The function generator of FIG. 2 further comprises a current source 16 for absorbing a current from the cathode terminal of the diode series 13 so that a constant current can flow from the diode series 13 regardless of the ambient temperature, a current source 17 for absorbing a current from the cathode terminal of the diode series 14 so that a current in proportion to a difference between the ambient temperature and the reference temperature can flow from the diode series 14, an output terminal 1 for outputting a current, and an output circuit 28 for discharging a current through the output terminal 1. The output circuit 28 includes an output PNP transistor 9 and an operational amplifier 25. The collector of the output PNP transistor 9 is connected with the output terminal 1, and the base thereof is connected with the cathode terminal of the diode series 14. The operational amplifier 25 works as a voltage follower so that a voltage equal to the voltage at the cathode terminal of the diode series 13 can be supplied to the emitter of the output PNP transistor 9. Accordingly, a differential voltage of the voltage at the cathode terminal of the diode series 13 and the voltage at the cathode terminal of the diode series 14 is applied between the base and the emitter of the output PNP transistor 9.

In the function generator of FIG. 2, a current absorbed by the current source 16 is indicated as $I_0$, a current absorbed by the current source 17 is indicated as $I_T$, the voltage at the cathode terminal of the diode series 13 is indicated as $V_1$ and the voltage at the cathode terminal of the diode series 14 is indicated as $V_2$. Also, the saturation current of the respective diodes and transistors is indicated as $I_S$. In this case, the respective voltages can be obtained by the following formulas:

$$V_1 = NV_T \ln(I_0/I_S) \tag{13}$$

$$V_2 = (N+1)V_T \ln(I_T/I_S) \tag{14}$$

$$V_T = kT_a/q \tag{15}$$

When the collector current of the output PNP transistor 9 is indicated as I, the current I is obtained as follows:

$$I = I_S \exp\{(V_1 - V_2)/V_T\} \tag{16}$$

On the basis of Formulas (13), (14) and (16), the following relationship can be obtained:

$$I = I_0(I_T/I_0)^{N+1} \tag{17}$$

At this point, it is assumed that when $T_a \geq T_0$, the following formula holds:

$$I_T = 0 \tag{18}$$

and that when $T_a < T_0$, the following formula holds:

$$I_T = \{|T_a - T_0|/T_0\}I_0 \tag{19}$$

Specifically, when the ambient temperature $T_a$ is equal to or higher than the reference temperature $T_0$, the current source 17 cuts the current flow from the diode series 14, and when the ambient temperature $T_a$ is lower than the reference temperature $T_0$, the current source 17 absorbs the current $I_T$ which increases as the ambient temperature $T_a$ decreases (namely, a current in proportion to $|T_a - T_0|$) from the diode series 14. In this case, on the basis of Formulas (17) and (19), when $T_a < T_0$, the following relationship holds:

$$I = I_0\{|T_a - T_0|\}^{N+1} \tag{20}$$

Accordingly, the current I flowing from the collector of the output PNP transistor 9 through the output terminal 1 is in proportion to the power of $|T_a - T_0|$. For example, when N+2, the current I is in proportion to the cube of $|T_a - T_0|$.

Also, in the function generator of FIG. 2, it is assumed that when $T_a \geq T_0$, the following formula holds:

$$I_T = \{(T_a - T_0)/T_0\}I_0 \tag{21}$$

and that when $T_a < T_0$, the following formula holds:

$$I_T = 0 \tag{22}$$

In this case, when $T_a \geq T_0$, the following relationship can be obtained:

$$I = I_0\{(T_a - T_0)/T_0\}^{N+1} \tag{23}$$

In this manner, in the function generator of FIG. 2, a current in proportion to the power of a difference between the ambient temperature $T_a$ and the reference temperature $T_0$ can be discharged through the output terminal 1.

Figure 3:
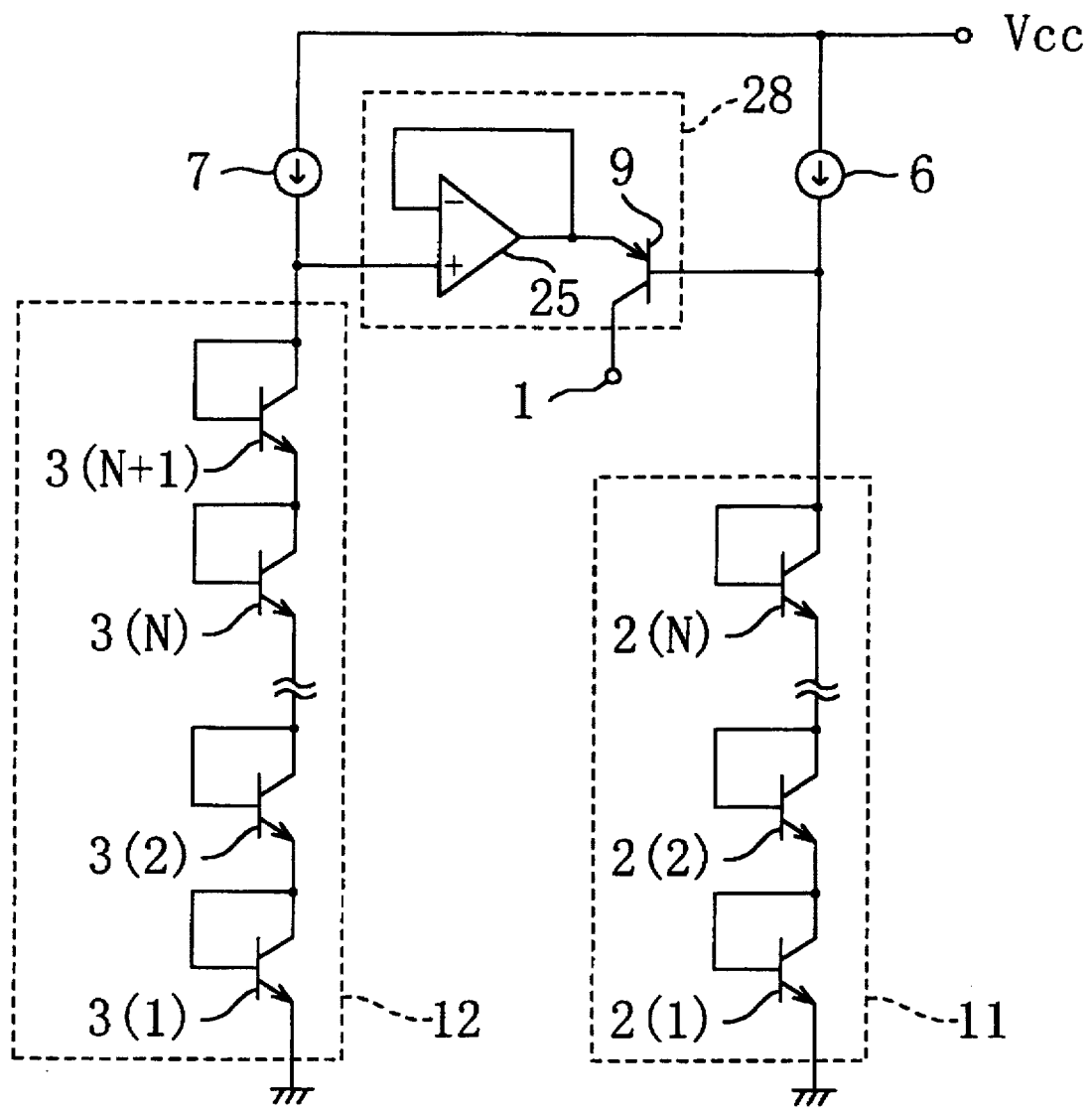
FIG. 3 is a circuit diagram for showing still another example of the configuration of the function generator of this invention.

FIG. 3 shows still another exemplified configuration of the function generator of this invention. The function generator of FIG. 3 can be attained by modifying the configuration of the output circuit 18 of FIG. 1. An output circuit 28 of FIG. 3 includes an output PNP transistor 9 and an operational amplifier 25. The collector of the output PNP transistor 9 is connected with the output terminal 1, and the base thereof is connected with the anode terminal of the diode series 11. The operational amplifier 25 works as a voltage follower so that a voltage equal to the voltage at the anode terminal of the diode series 12 can be supplied to the emitter of the output PNP transistor 9. Accordingly, a differential voltage of the voltage at the anode terminal of the diode series 12 and the voltage at the anode terminal of the diode series 11 is applied between the base and the emitter of the output PNP transistor 9. By adopting the circuit configuration shown in FIG. 3, a current in proportion to the power of a difference between the ambient temperature $T_a$ and the reference temperature $T_0$ can be discharged from the output terminal 1 as in the circuit configuration shown in FIG. 2.

When the output circuit 28 of FIG. 2 is replaced with an output circuit including an output NPN transistor and an operational amplifier, a current in proportion to the power of a difference between the ambient temperature $T_a$ and the reference temperature $T_O$ can be absorbed through the output terminal 1 as in the circuit configuration shown in FIG. 1. In this case, the collector of the output NPN transistor is connected with the output terminal 1 and the base thereof is connected with the cathode terminal of the diode series 13, and the operational amplifier works as a voltage follower so that a voltage equal to the voltage at the cathode terminal of the diode series 14 can be supplied to the emitter of the output NPN transistor.

Figure 4:
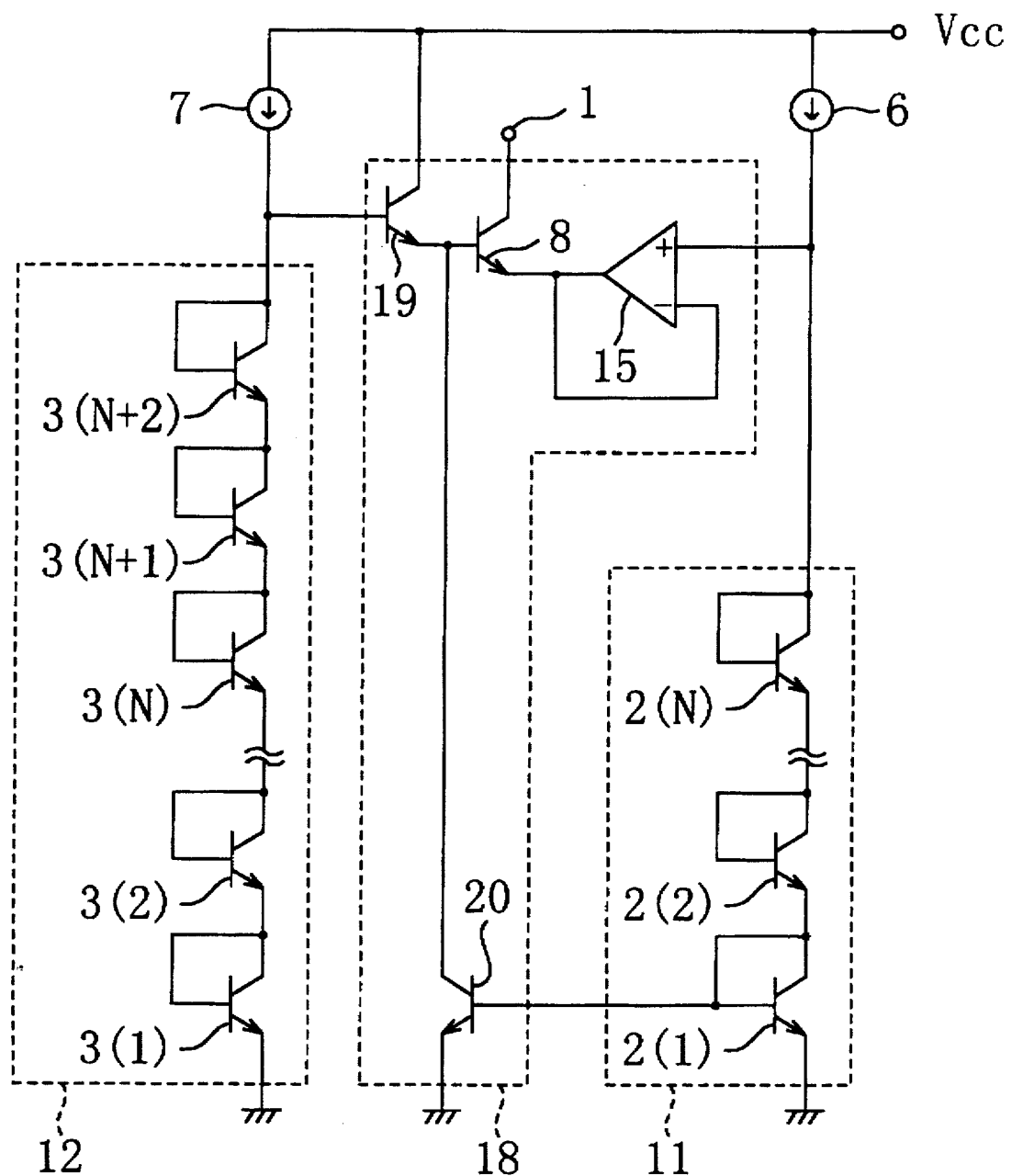
FIG. 4 is a circuit diagram for showing still another example of the configuration of the function generator of this invention.

FIG. 4 shows still another exemplified configuration of the function generator of this invention. The function generator of FIG. 4 comprises a diode series 11 of N diodes 2 in series, each of which is composed of an NPN transistor with its base connected with its own collector, and a diode series 12 of N+2 diodes 3 in series, each of which is composed of an NPN transistor with its base connected with its own collector. The voltage at the cathode terminal of each of the diode series 11 and 12 is fixed at the ground voltage. The function generator of FIG. 4 further comprises a current source 6 for discharging a current to the anode terminal of the diode series 11 so that a constant current can flow into the diode series 11 regardless of the ambient temperature, a current source 7 for discharging a current to the anode terminal of the diode series 12 so that a current in proportion to a difference between the ambient temperature and the reference temperature can flow into the diode series 12, an output terminal 1 for outputting a current, and an output circuit 18 for absorbing a current through the output terminal 1. The output circuit 18 comprises an output transistor including a Darlington connection of two NPN transistors 8 and 19, an NPN transistor 20 for forming a current mirror circuit, and an operational amplifier 15 working as a voltage follower. Specifically, the collector of the NPN transistor 8 is connected with the output terminal 1, the emitter of the NPN transistor 19 is connected with the base of the NPN transistor 8, and the base of the NPN transistor 19 is connected with the anode terminal of the diode series 12. The collector of the NPN transistor 19 is supplied with a supply voltage $V_{cc}$. The NPN transistor 20 draws a current equal to the current flowing to the diode series 11 from the emitter of the NPN transistor 19. The operational amplifier 15 supplies a voltage equal to the voltage at the anode terminal of the diode series 11 to the emitter of the NPN transistor 8.

In the function generator of FIG. 4, a current flowing from the current source 6 is indicated as $I_O$, a current flowing from the current source 7 is indicated as $I_T$, the voltage at the anode terminal of the diode series 11 is indicated as $V_1$, the voltage at the anode terminal of the diode series 12 is indicated as $V_2$ and the emitter/base voltage of the NPN transistor 19 is indicated as $V_{19}$. Also, the saturation current of the respective diodes and transistors is indicated as $I_S$. In this case, the respective voltages can be obtained by the following formulas:

$$V_1 = N V_T \ln(I_O/I_S) \quad (24)$$

$$V_2 = (N+2) V_T \ln(I_T/I_S) \quad (25)$$

$$V_{19} = V_T \ln(I_O/I_S) \quad (26)$$

$$V_T = kT_a/q \quad (27)$$

When the collector current of the output NPN transistor 8 is indicated as I, the current I is represented as follows:

$$I = I_S \exp\{(V_2 - V_1 - V_{19})/V_T\} \quad (28)$$

On the basis of Formulas (24), (25), (26) and (28), the following formula can be obtained:

$$I = I_O (I_T/I_O) \quad (29)$$

At this point, it is assumed that when $T_a > T_O$, the following formula holds:

$$I_T = \{(T_a - T_O)/T_O\} I_O \quad (30)$$

and that when $T_a < T_O$, the following formula holds:

$$I_T = 0 \quad (31)$$

In this case, on the basis of Formulas (29) and (30), when $T_a \geq T_O$, the following relationship holds:

$$I = I_O \{(T_a - T_O)/T_O\}^{N+2} \quad (32)$$

Accordingly, the current I absorbed by the collector of the output NPN transistor 8 through the output terminal 1 is in proportion to the power of $T_a - T_O$. For example, when N=1, the current I is in proportion to the cube of $T_a - T_O$.

Also, in the function generator of FIG. 4, it is assumed that when $T_a \geq T_O$, the following formula holds:

$$I_T = 0 \quad (33)$$

and that when $T_a < T_O$, the following formula holds:

$$I_T = \{|T_a - T_O|/T_O\} I_O \quad (34)$$

In this case when $T_a < T_O$, the following formula can be obtained:

$$I = I_O \{|T_a - T_O|/T_O\}^{N+2} \quad (35)$$

In this manner, in the function generator of FIG. 4, a current in proportion to the power of a difference between the ambient temperature $T_a$ and the reference temperature $T_O$ can be absorbed through the output terminal 1.

Figure 5:
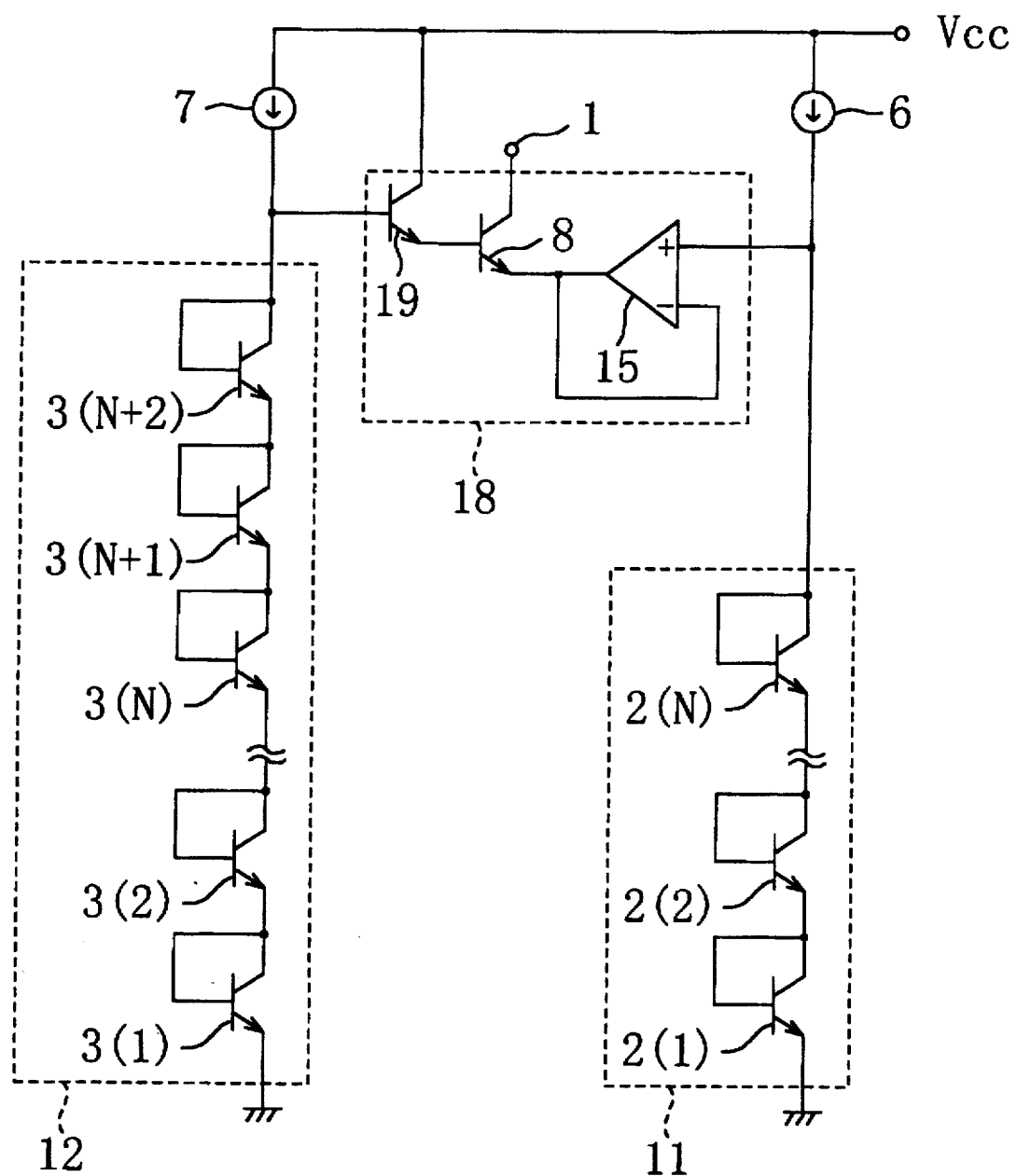
FIG. 5 is a circuit diagram for showing still another example of the configuration of the function generator of this invention.

FIG. 5 shows still another exemplified configuration of the function generator of this invention. The function generator of FIG. 5 can be obtained by eliminating the NPN transistor 20 from the configuration shown in FIG. 4. In the function generator of FIG. 5, Formula (26) is substituted with the following formula:

$$V_{19} = V_T \ln\{I/(h_{FE} \cdot I_S)\} \quad (36)$$

wherein $h_{FE}$ indicates a current amplification ratio of each of the NPN transistors 8 and 19. Accordingly, on the basis of Formulas (24), (25), (36) and (28), the following formula can be obtained:

$$I = I_O (I_T/I_O)^{(N+2)/2} \cdot (h_{FE})^{1/2} \quad (37)$$

At this point, it is assumed that when $T_a \geq T_O$, the following formula holds:

$$I_T = \{(T_a - T_O)/T_O\} I_O \quad (38)$$

and that when $T_a < T_O$, the following formula holds:

$$I_T = 0 \quad (39)$$

In this case, on the basis of Formulas (37) and (38), when $T_a \geq T_O$, the following relationship can be obtained:

$$I = I_O \{(T_a - T_O)/T_O\}^{(N+2)/2} \cdot (h_{FE})^{1/2} \quad (40)$$

Accordingly, the current I absorbed by the collector of the output NPN transistor 8 through the output terminal 1 is in proportion to the power of $T_a - T_O$. For example, when N=4, the current I is in proportion to the cube of $T_O - T_O$.

Also, in the function generator of FIG. 5, it is assumed that when $T_a \geq T_0$, the following formula holds:

$$I_T = 0 \quad (41)$$

and that when $T_a < T_0$, the following formula holds:

$$I_T = \{|T_a - T_0|/T_0\}I_0 \quad (42)$$

In this case, when $T_a < T_0$, the following relationship can be obtained:

$$I = I_0\{|T_a - T_0|/T_0\}^{(N+2)/2} \cdot (h_{FE})^{1/2} \quad (43)$$

In this manner, in the function generator of FIG. 5, a current in proportion to the power of a difference between the ambient temperature $T_a$ and the reference temperature $T_0$ can be absorbed through the output terminal 1.

Figure 6:
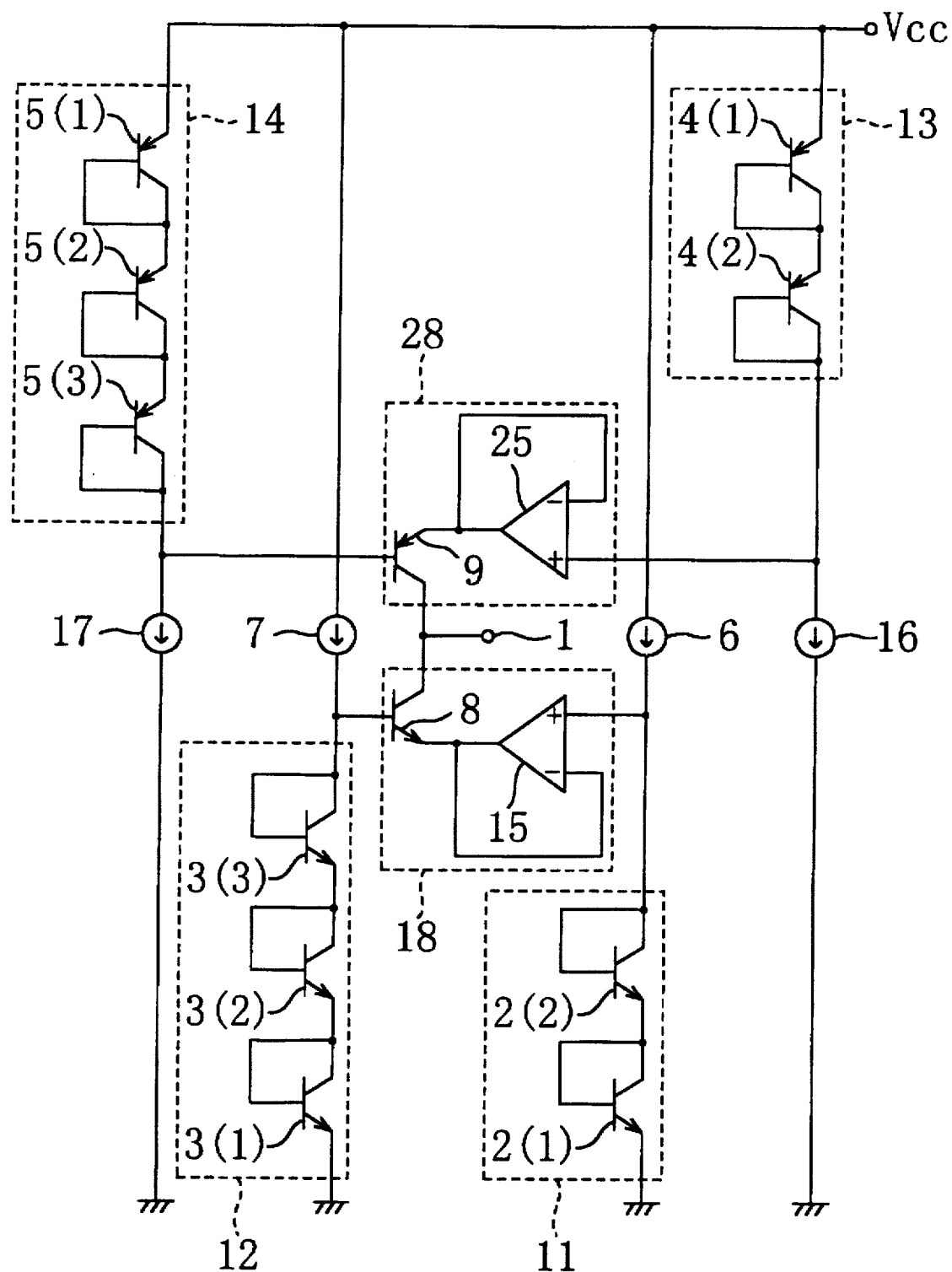
FIG. 6 is a circuit diagram for showing still another example of the configuration of the function generator of this invention.

FIG. 6 shows still another exemplified configuration of the function generator of this invention. The configuration of FIG. 6 can be obtained by combining the configurations of FIG. 1 and FIG. 2, whereas N=2. In the function generator of FIG. 6, a current flowing from the current source 6 and a current absorbed by the current source 16 are respectively indicated as $I_0$, a current flowing from the current source 7 is indicated as $I_{T1}$, and a current absorbed by the current source 17 is indicated as $I_{T2}$.

In the function generator of FIG. 6, it is assumed that when $T_a \geq T_0$, the following formulas hold:

$$I_{T1} = \{(T_a - T_0)/T_0\}I_0 \quad (44)$$

$$I_{T2} = 0 \quad (45)$$

and that when $T_a < T_0$, the following formulas hold:

$$I_{T1} = 0 \quad (46)$$

$$I_{T2} = \{|T_a - T_0|/T_0\}I_0 \quad (47)$$

In this case, when $T_a \geq T_0$, the following relationship can be obtained:

$$I = I_0\{(T_a - T_0)/T_0\}^3 \quad (48)$$

and when $T_a < T_0$, the following relationship can be obtained:

$$I = I_0\{|T_a - T_0|/T_0\}^3 \quad (49)$$

Accordingly, the current I represented by Formula (48), namely, the current absorbed by the collector of the output NPN transistor 8 through the output terminal 1 when $T_a \geq T_0$, is in proportion to the cube of $T_a - T_0$, and the current I represented by Formula (49), namely, the current flowing from the collector of the output PNP transistor 9 through the output terminal 1 when $T_a < T_0$, is in proportion to the cube of $|T_a - T_0|$.

Also, in the function generator of FIG. 6, it is assumed that when $T_a \geq T_0$, the following formulas hold:

$$I_{T1} = 0 \quad (50)$$

$$I_{T2} = \{(T_a - T_0)/T_0\}I_0 \quad (51)$$

and that when $T_a < T_0$, the following formulas hold:

$$I_{T1} = \{|T_a - T_0|/T_0\}I_0 \quad (52)$$

$$I_{T2} = 0 \quad (53)$$

In this case, when $T_a - T_0$, the following relationship can be obtained:

$$I = I_0\{(T_a - T_0)/T_0\}^3 \quad (54)$$

and when $T_a < T_0$, the following relationship can be obtained:

$$I = I_0\{|T_a - T_0|/T_0\}^3 \quad (55)$$

Accordingly, the current I represented by Formula (54), namely, the current flowing from the collector of the output PNP transistor 9 through the output terminal 1 when $T_a \geq T_0$, is in proportion to the cube of $T_a - T_0$, and the current I represented by Formula (55), namely, the current absorbed by the collector of the output NPN transistor 8 through the output terminal 1 when $T_a < T_0$, is in proportion to the cube of $|T_a - T_0|$.

In this manner, in the function generator of FIG. 6, in accordance with the range of the ambient temperature $T_a$, a current in proportion to the cube of a difference between the ambient temperature $T_a$ and the reference temperature $T_0$ can be absorbed through the output terminal 1 or a current in proportion to the cube of a difference between the ambient temperature $T_a$ and the reference temperature $T_0$ can be discharged from the output terminal 1.

Figure 7:
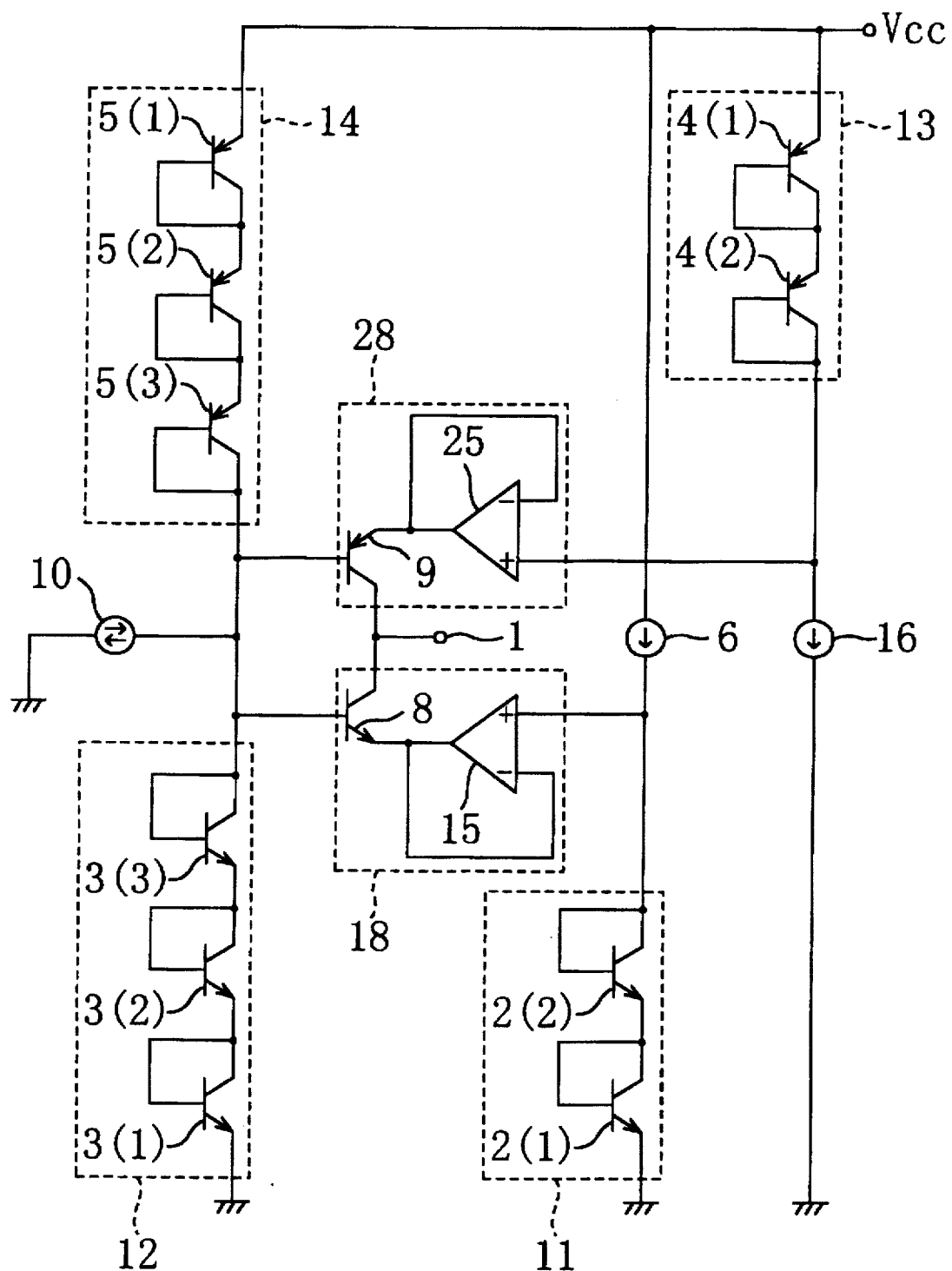
FIG. 7 is a circuit diagram for showing still another example of the configuration of the function generator of this invention.

FIG. 7 shows still another exemplified configuration of the function generator of this invention. The configuration of FIG. 7 can be obtained by replacing the two current sources 7 and 17 of FIG. 6 with a common current source 10. The current source 10 of FIG. 7 is a bidirectional current source for discharging a current which increases as the ambient temperature $T_a$ increases (i.e., a current in proportion to $T_a - T_0$) when $T_a \geq T_0$, and for absorbing a current which increases as the ambient temperature $T_a$ decreases (i.e., a current in proportion to $|T_a - T_0|$) when $T_a < T_0$. Accordingly, when $T_a \geq T_0$, the current absorbed by the collector of the output NPN transistor 8 through the output terminal 1 is in proportion to the cube of $T_a - T_0$, and when $T_a < T_0$, the current discharged from the collector of the output PNP transistor 9 is in proportion to the cube of $|T_a - T_0|$. Also, when it is assumed that a current in proportion to $T_a - T_0$ is absorbed by the current source 10 in the case of $T_a - T_0$ and that a current in proportion to $|T_a - T_0|$ is discharged by the current source 10 in the case of $T_a < T_0$, a current flowing from the collector of the output PNP transistor 9 through the output terminal 1 in the case of $T_a \geq T_0$ is in proportion to the cube of $T_a - T_0$, and a current absorbed by the collector of the output NPN transistor 8 through the output terminal 1 in the case of $T_a < T_0$ is in proportion to the cube of $|T_a - T_0|$.

Figure 8:
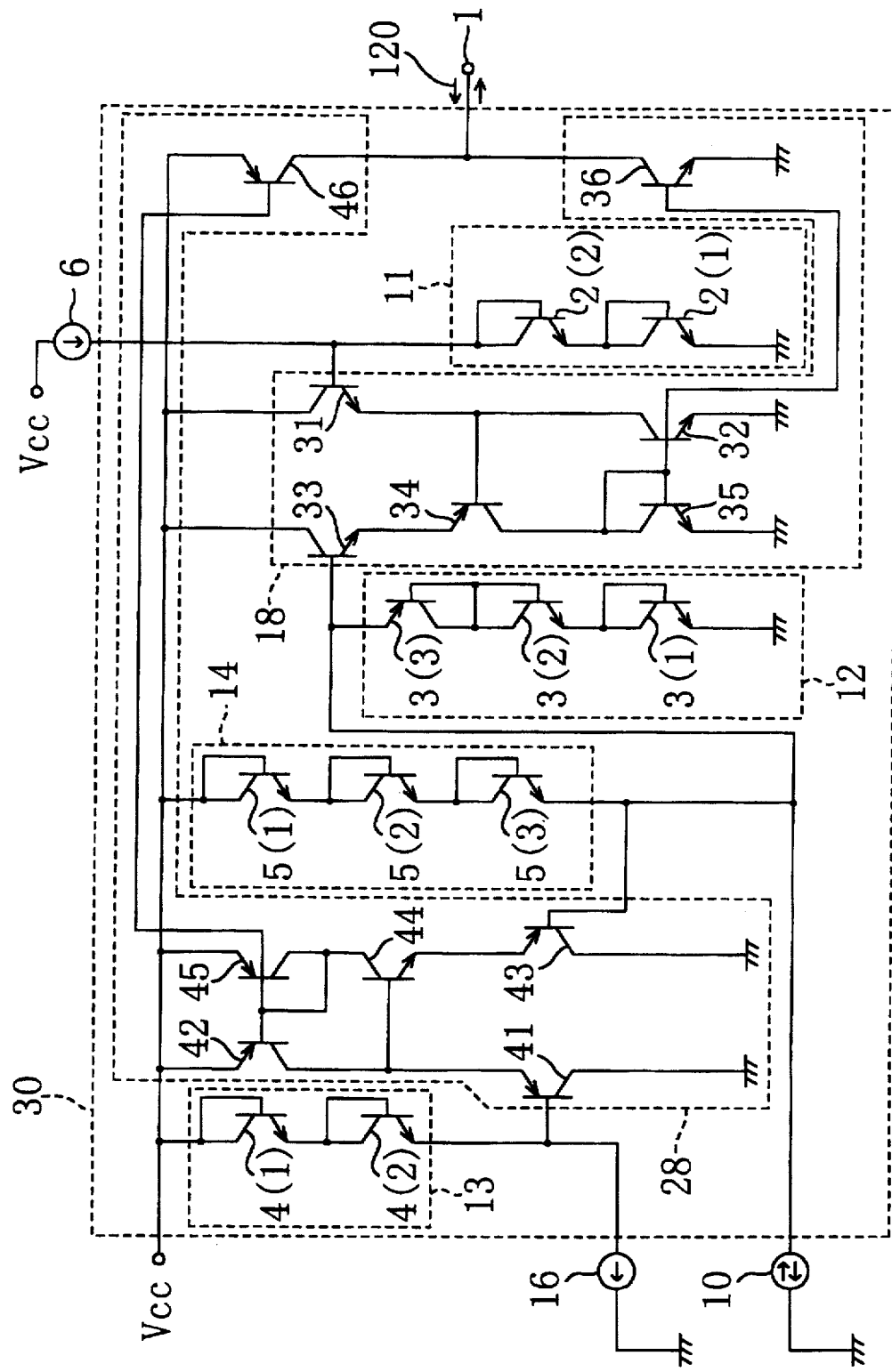
FIG. 8 is a circuit diagram for showing still another example of the configuration of the function generator of this invention.

FIG. 8 shows still another exemplified configuration of the function generator of this invention. A cubic function generator 30 shown in FIG. 8 can be obtained by modifying the configurations of the four diode series 11, 12, 13 and 14 and the two output circuits 18 and 28 of FIG. 7. In the configuration of FIG. 8, each of two diodes 2 in a diode series 11, two diodes 4 in a diode series 13 and three diodes 5 in a diode series 14 is composed of an NPN transistor. A diode series 12 includes two NPN transistors 3 and one PNP transistor 3. An output circuit 18 includes five NPN transistors 31, 32, 33, 35 and 36 and one PNP transistor 34, and an output circuit 28 includes five PNP transistors 41, 42, 43, 45 and 46 and one NPN transistor 44.

In the function generator of FIG. 8, a differential voltage of the voltage at the anode terminal of the diode series 12 and the voltage at the anode terminal of the diode series 11 is applied between the base and the emitter of the PNP transistor 34, and a current in accordance with the collector current of the PNP transistor 34 is absorbed through the output terminal 1. Also, a differential voltage of the voltage at the cathode terminal of the diode series 13 and the voltage at the cathode terminal of the diode series 14 is applied between the base and the emitter of the NPN transistor 44, and a current in accordance with the collector current of the NPN transistor 44 is discharged through the output terminal 1. A reference numeral 120 in FIG. 8 denotes a current flowing through the output terminal 1.

The function generator of FIG. 8 is operated in the same manner as that of FIG. 7. Accordingly, when it is assumed that a current increasing as the increase of the ambient temperature $T_a$ (i.e., a current in proportion to $T_a-T_0$) is discharged by the current source 10 when $T_a<T_0$, and that a current increasing as the decrease of the ambient temperature $T_a$ (i.e., a current in proportion to $|T_a-T_0|$) is absorbed by the current source 10 when $T_a<T_0$, the current absorbed through the output terminal 1 in the case of $T_a \geq T_0$ is in proportion to the cube of $T_a-T_0$, and the current discharged through the output terminal 1 in the case of $T_a<T_0$ is in proportion to the cube of $|T_a-T_0|$.

Figure 9:
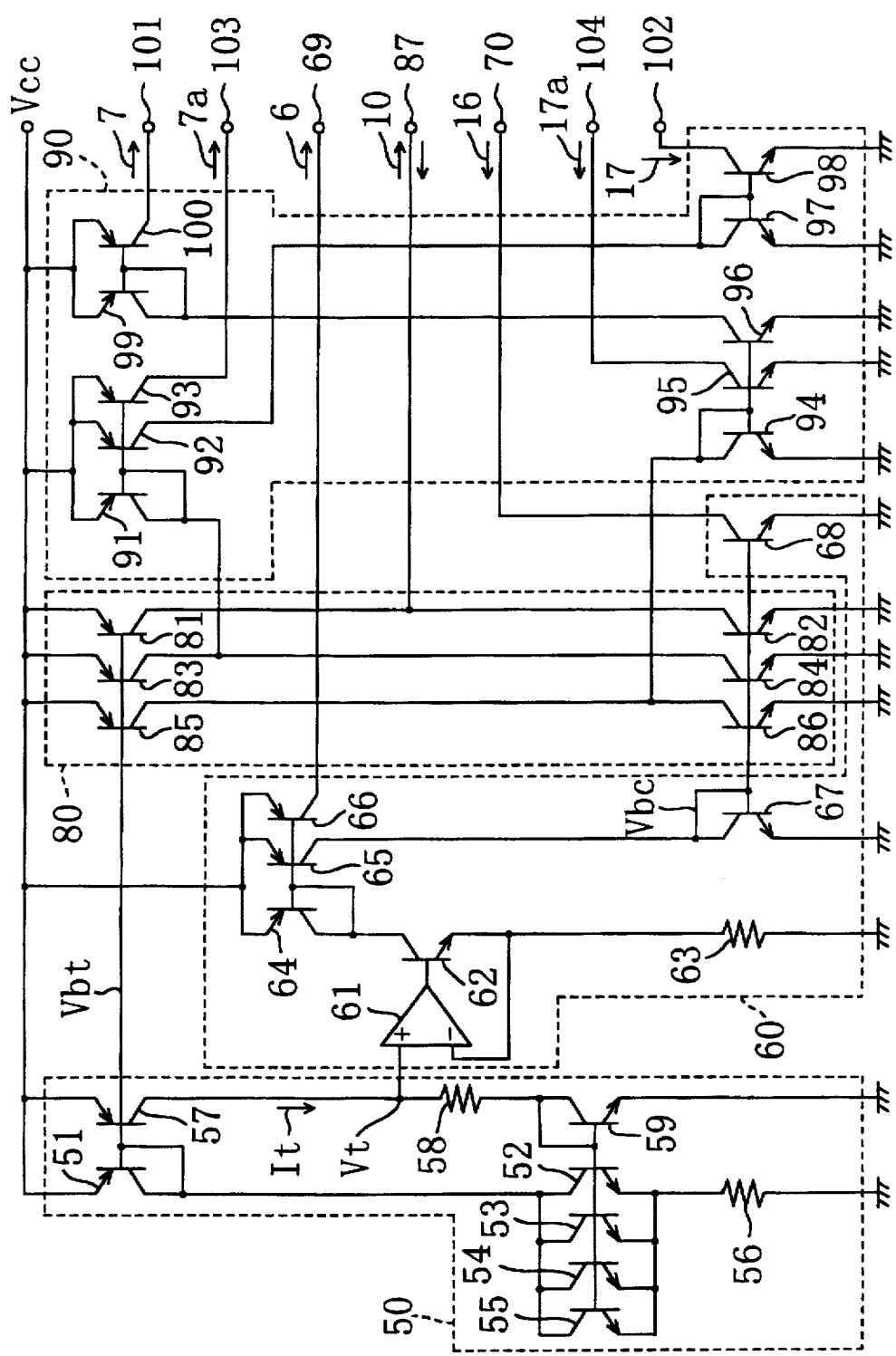
FIG. 9 is a circuit diagram for showing the detailed configuration of current sources used in FIGS. 1 through 8.

FIG. 9 shows the detailed configuration of the current sources 6, 7, 10, 16 and 17 shown in FIGS. 1 through 8. The configuration of FIG. 9 includes a band-gap type current/voltage generator 50, a first current supplying circuit 60, a second current supplying circuit 80 and a third current supplying circuit 90.

The band-gap type current/voltage generator 50 includes two PNP transistors 51 and 57, five NPN transistors 52, 53, 54, 55 and 59, and two resistors 56 and 58, and generates a collector current increasing in proportion to the ambient temperature $T_a$ in the PNP transistor 51. The common base voltage $V_{br}$ of the two PNP transistors 51 and 57 together forming a current mirror circuit can be represented by a linear function of the ambient temperature $T_a$. Therefore, a collector current $I_r$ of the PNP transistor 57 increases in proportion to the ambient temperature $T_a$, and a voltage $V_r$ generated by the resistor 58 and the NPN transistor 59 also increases in proportion to the ambient temperature $T_a$.

The first current supplying circuit 60 includes an operational amplifier 61, three NPN transistors 62, 67 and 68, three PNP transistors 64, 65 and 66, and one resistor 63. A circuit formed by the operational amplifier 61, the NPN transistor 62 and the resistor 63 generates a constant collector current unaffected by the ambient temperature $T_a$ in the NPN transistor 62 on the basis of the voltage $V_r$ supplied by the band-gap type current/voltage generator 50. The collector current of the NPN transistor 62 is transferred to a terminal 69 through the PNP transistors 64 and 66 and is also transferred to a terminal 70 through the PNP transistors 64 and 65 and the NPN transistors 67 and 68. Specifically, the terminal 69 works as the terminal of a current source 6 for outputting a constant current regardless of the ambient temperature $T_a$, and the terminal 70 works as the terminal of a current source 16 for absorbing a constant current regardless of the ambient temperature $T_a$. In this case, the common base voltage $V_{bc}$ of the two NPN transistors 67 and 68 together forming the current mirror circuit is constant regardless of the ambient temperature $T_a$.

The second current supplying circuit 80 includes three PNP transistors 81, 83 and 85, which are commonly supplied with the base voltage $V_{br}$ of the band-gap type current/voltage generator 50, and three NPN transistors 82, 84 and 86, which are commonly supplied with the base voltage $V_{bc}$ of the first current supplying circuit 70. Accordingly, the collector current of each of the three PNP transistors 81, 83 and 85 increases in proportion to, the ambient temperature $T_a$, while the collector current of each of the three NPN transistors 82, 84 and 86 is constant regardless of the ambient temperature $T_a$. The collector current of the PNP transistor 81 and the collector current of the NPN transistor 82 are added to each other as an output current from a terminal 87. Accordingly, by adjusting the resistance value of the resistor 63, the terminal 87 works as the terminal of a bidirectional current source 10 for discharging a current increasing as the increase of the ambient temperature $T_a$ (i.e., a current in proportion to $T_a-T_0$) in the case of $T_a \geq T_0$ and for absorbing a current increasing as the decrease of the ambient temperature $T_a$ (i.e., a current in proportion to $|T_a-T_0|$) in the case of $T_a<T_0$. Similarly, the transistor pair including the PNP transistor 83 and the NPN transistor 84 and the transistor pair including the PNP transistor 85 and the NPN transistor 86 respectively supply bidirectional currents to the third current supplying circuit 90.

The third current supplying circuit 90 includes five PNP transistors 91, 92, 93, 99 and 100 and five NPN transistors 94, 95, 96, 97 and 98. Owing to the current transferring/cutting function of these transistors, a terminal 101 connected with the collector of the PNP transistor 100 works as the terminal of a current source 7 for cutting a current in the case of $T_a \leq T_0$ and for discharging a current increasing as the increase of the ambient temperature $T_a$ in the case of $T_a > T_0$, and a terminal 102 connected with the collector of the NPN transistor 98 works as the terminal of a current source 17 for cutting a current in the case of $T_a \geq T_0$ and for absorbing a current increasing as the decrease of the ambient temperature $T_a$ in the case of $T_a<T_0$. Also, a terminal 103 connected with the collector of the PNP transistor 93 works as the terminal of a current source 7a for cutting a current in the case of $T_a \geq T_0$ and for discharging a current increasing as the decrease of the ambient temperature $T_a$ in the case of $T_a<T_0$, and a terminal 104 connected with the collector of the NPN transistor 95 works as the terminal of a current source 17a for cutting a current in the case of $T_a \leq T_0$ and for absorbing a current increasing as the increase of the ambient temperature $T_a$ in the case of $T_a>T_0$. When the terminal 103 and the terminal 104 are connected with each other, a bidirectional current source for absorbing a current increasing as the increase of the ambient temperature $T_a$ in the case of $T_a \geq T_0$ and for discharging a current increasing as the decrease of the ambient temperature $T_a$ in the case of $T_a<T_0$ can be formed.

Figure 10:
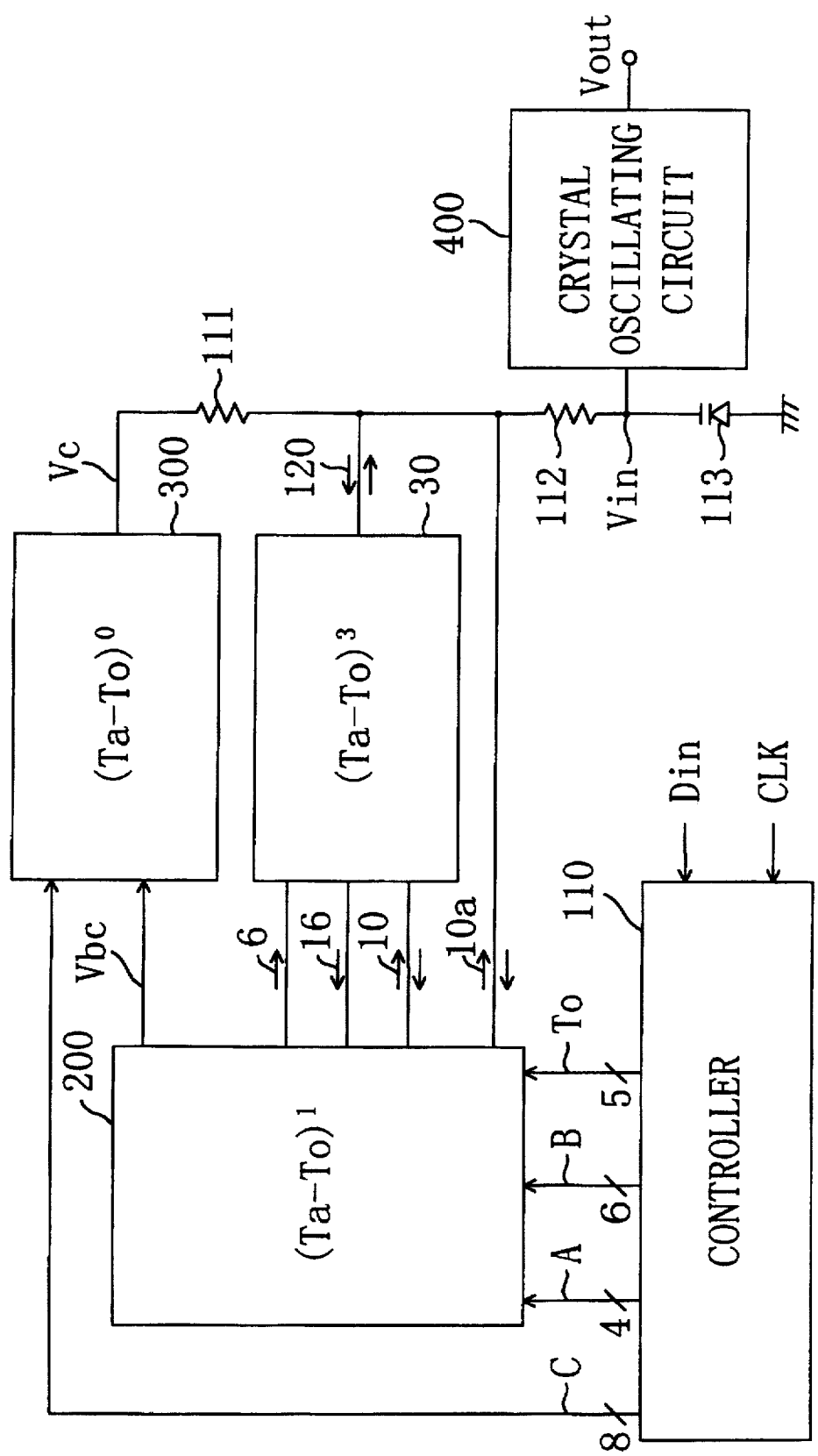
FIG. 10 is a block diagram for showing an example of the configuration of a temperature-compensated crystal oscillator of this invention.

FIG. 10 shows an exemplified configuration of the temperature-compensated crystal oscillator of this invention comprising the cubic function generator 30 of FIG. 8. The crystal oscillator of FIG. 10 further comprises a controller 110, a linear function generator 200, a zero-order function generator 300, two resistors 111 and 112, a variable capacitance diode 113 and a crystal oscillating circuit 400. The controller 110 is a shift register including twenty-three flip-flops for receiving a serial data signal $D_{in}$ and a shift clock signal CLK and supplying signals corresponding to the four constants A, B, C and $T_0$ in Formula (1). Signals A, B, C and $T_0$ are respectively of four bits, six bits, eight bits and five bits. In response to the signals A, B and $T_0$, the linear function generator 200 performs the following functions: The function to supply a constant base voltage $V_{bc}$ unaffected by the ambient temperature $T_a$; the function of a current source 6 to discharge a constant current unaffected by the ambient temperature $T_a$; the function of a current source 16 to absorb a constant current unaffected by the ambient temperature $T_a$; the function of a current source 10 to discharge a current in proportion to $T_a-T_0$ in the case of $T_a \geq T_0$ and absorb a current in proportion to $|T_a-T_0|$ in the case of $T_a<T_0$; and the function of a current source 10a to discharge a current in proportion to $T_a-T_0$ in the case of $T_a \geq T_0$ and absorb a current in proportion to $|T_a-T_0|$ in the case of $T_a<T_0$. The cubic function generator 30 connected with the current sources 6, 10 and 16 absorbs a current in proportion to the cube of $T_a-T_0$ in the case of $T_a \geq T_0$ and discharges a current in proportion to the cube of $|T_a-T_0|$ in the case of $T_a < T_0$ as described above. A reference numeral 120 in FIG. 10 denotes a bidirectional output current of the cubic function generator 30. The zero-order function generator 300 receives the base voltage $V_{bc}$ and the signal C, and generates a constant voltage $V_c$ regardless of the ambient temperature $T_a$. A series circuit including the two resistors 111 and 112 and the variable capacitance diode 113 constitutes means for converting the sum of the output current of the current source 10a obtained by one of the functions of the linear function generator 200 and the output current 120 of the cubic function generator 30 into a voltage and for supplying the sum of the voltage resulting from the conversion and the output voltage $V_c$ of the zero-order function generator 300 to the crystal oscillating circuit 400 as a compensation voltage $V_{in}$. The compensation voltage $V_{in}$ can be given by Formula (1). A voltage $V_{Out}$ shown in FIG. 10 is the output voltage of the crystal oscillating circuit 400.

Figure 11:
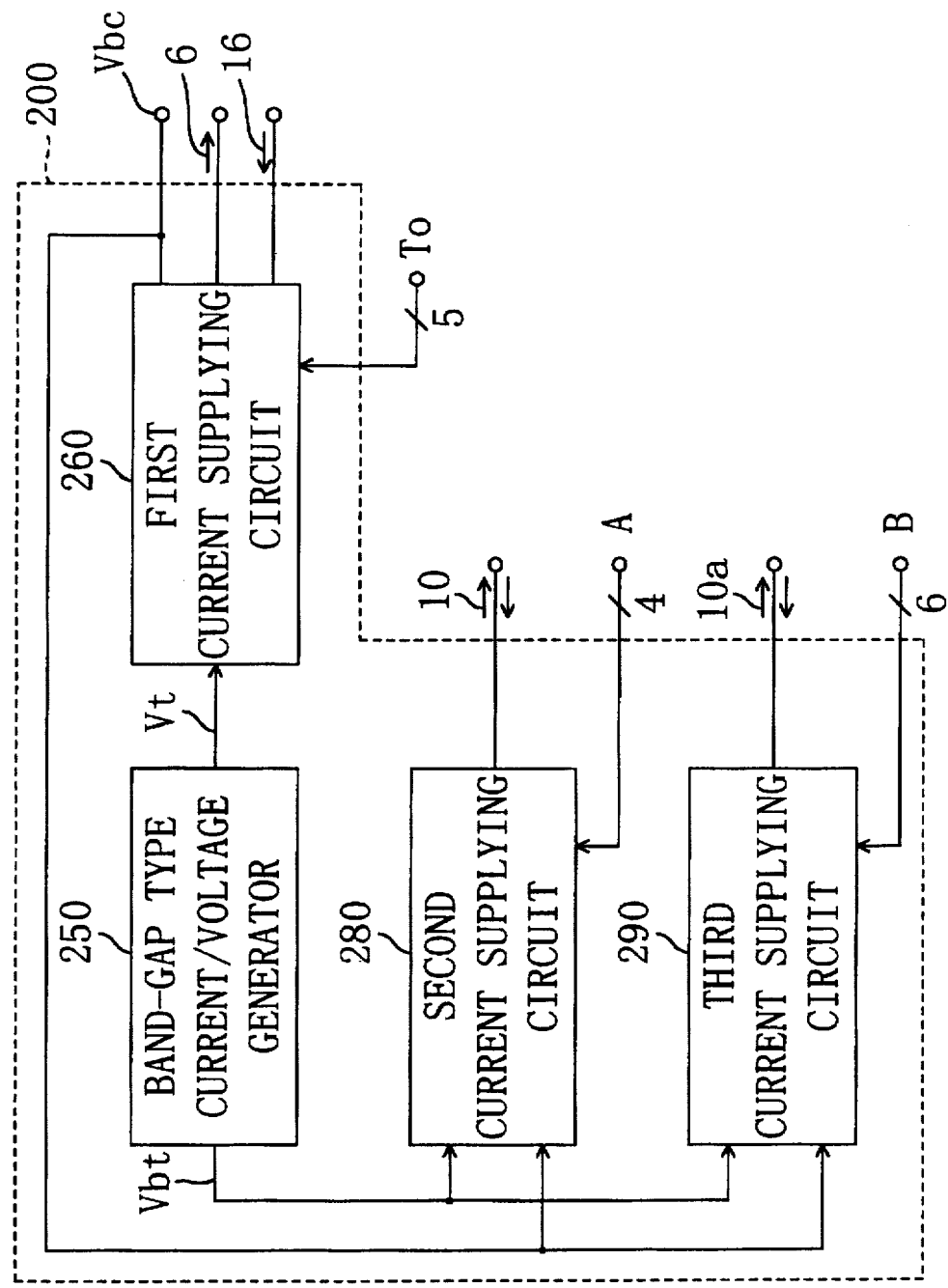
FIG. 11 is a block diagram for showing the configuration of a linear function generator of FIG. 10.

FIG. 11 shows the configuration of the linear function generator 200 of FIG. 10. The linear function generator 200 includes a band-gap type current/voltage generator 250, a first current supplying circuit 260, a second current supplying circuit 280 and a third current supplying circuit 290.

Figure 12:
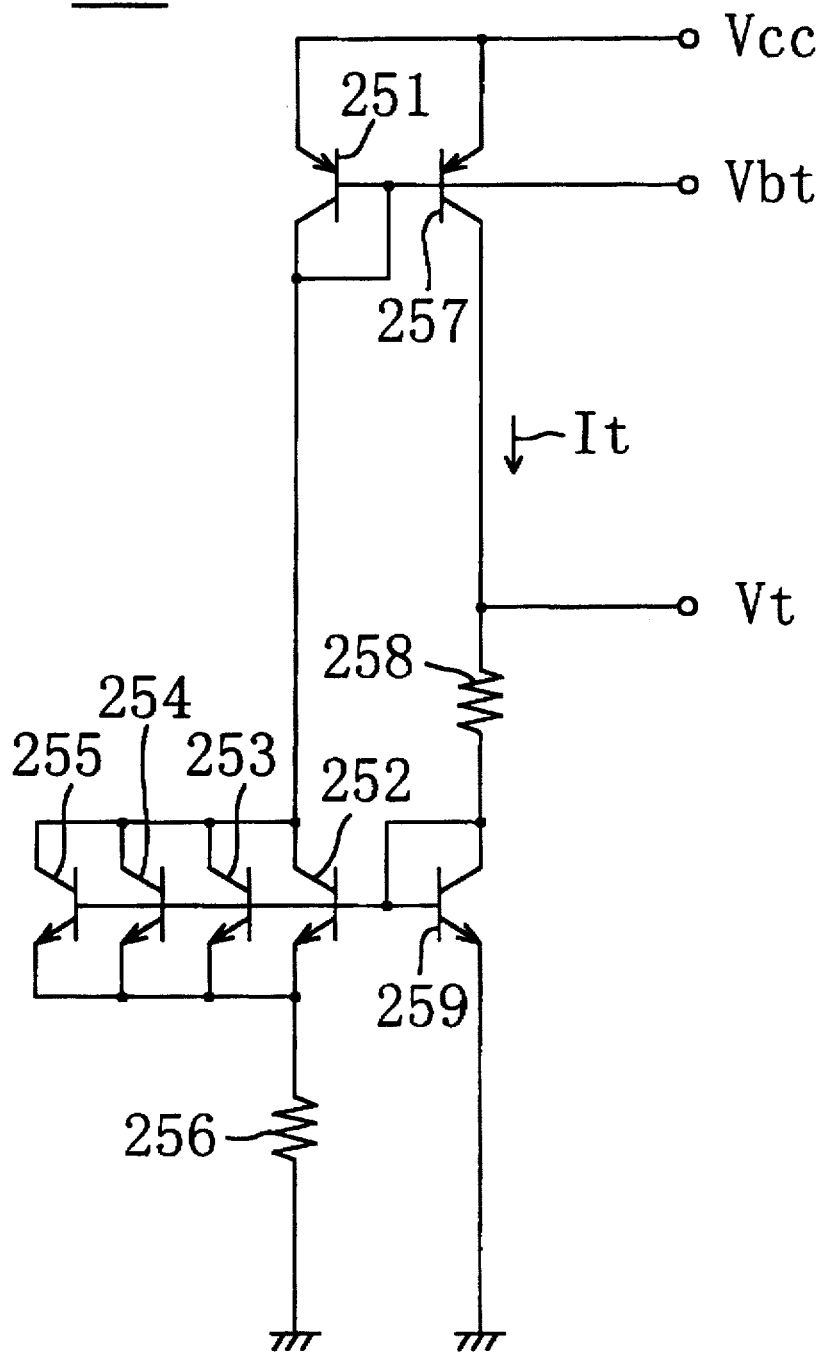
FIG. 12 is a circuit diagram for showing the detailed configuration of a band-gap type current/voltage generator of FIG. 11.

FIG. 12 shows the detailed configuration of the band-gap type current/voltage generator 250 of FIG. 11. The band-gap type current/voltage generator 250 of FIG. 12 includes, similarly to the band-gap type current/voltage generator 50 shown in FIG. 8, two PNP transistors 251 and 257, five NPN transistors 252, 253, 254, 255 and 259, and two resistors 256 and 258. A voltage $V_{bt}$ is a base voltage for transferring a current represented by a linear function of the ambient temperature $T_a$, a current $I_t$ is a current increasing in proportion to the ambient temperature $T_a$, and a voltage $V_t$ is a voltage increasing in proportion to the ambient temperature $T_a$.

Figure 13:
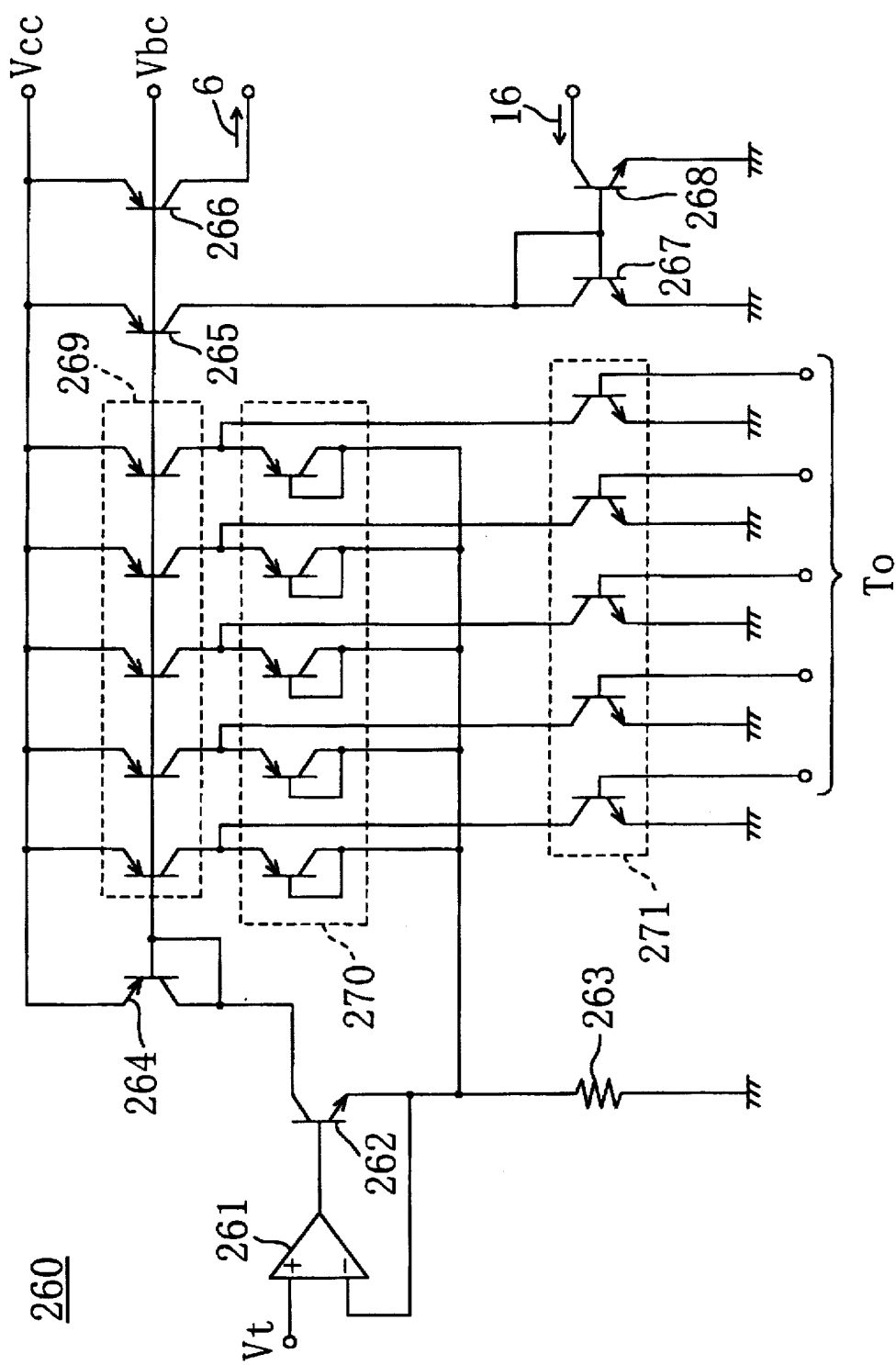
FIG. 13 is a circuit diagram for showing the detailed configuration of a first current supplying circuit of FIG. 11.

FIG. 13 shows the detailed configuration of the first current supplying circuit 260 of FIG. 11. The first current supplying circuit 260 of FIG. 13 includes, similarly to the first current supplying circuit 60 of FIG. 9, an operational amplifier 261, three NPN transistors 262, 267 and 268, three PNP transistors 264, 265 and 266 and one resistor 263. A voltage $V_{bc}$ is a constant base voltage unaffected by the ambient temperature $T_a$, to be used for current transfer. The first current supplying circuit 260 of FIG. 13 further comprises, correspondingly to the five bits of the signal $T_0$, five PNP transistors 269 sharing the base voltage $V_{bc}$, five PNP transistors 270 for current feedback to the emitter of the NPN transistor 262, and five NPN transistors 271 for switching. When the number of the on-transistors among the five NPN transistors 271 is changed in response to the signal $T_0$ of 5 bits, the output currents of the current sources 6 and 16 are varied in accordance of the changed number of the on-transistors.

Figure 14:
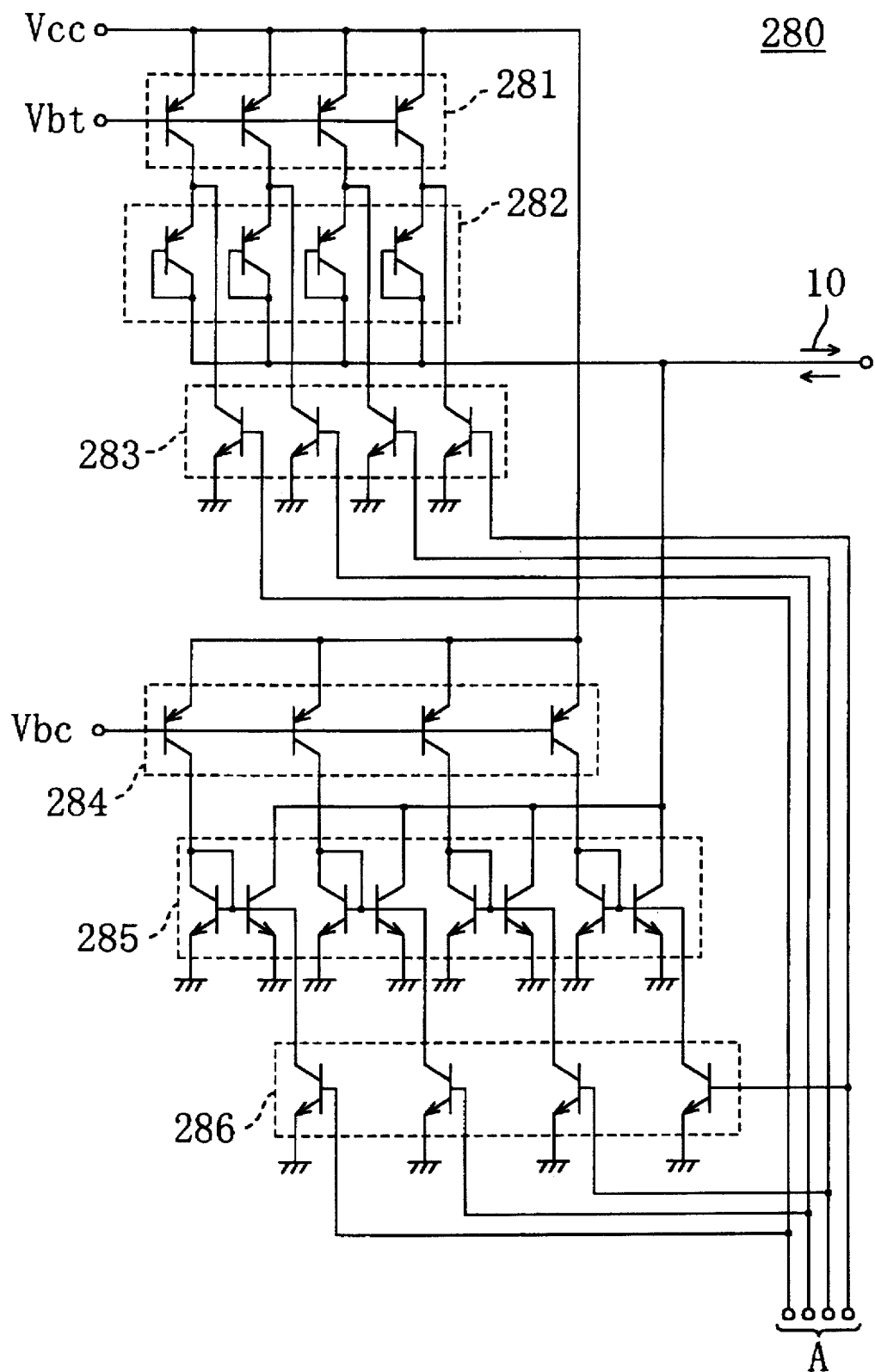
FIG. 14 is a circuit diagram for showing the detailed configuration of a second current supplying circuit of FIG. 11.

FIG. 14 shows the detailed configuration of the second current supplying circuit 280 of FIG. 11. The second current supplying circuit 280 of FIG. 14 comprises, correspondingly to the four bits of the signal A, four PNP transistors 281 sharing the base voltage $V_{bc}$, four PNP transistors 282 for discharging a current, four NPN transistors 283 for switching, four PNP transistors 284 sharing the base voltage $V_{bc}$, eight NPN transistors 285 together forming four current mirror circuits for absorbing a current, and four NPN transistors 286 for switching. When the numbers of the on-transistors among the four NPN transistors 283 and among the four NPN transistors 286 are changed in response to the signal A of four bits, the output current of the current source 10 is varied in accordance with the changed numbers of the on-transistors.

Figure 15:
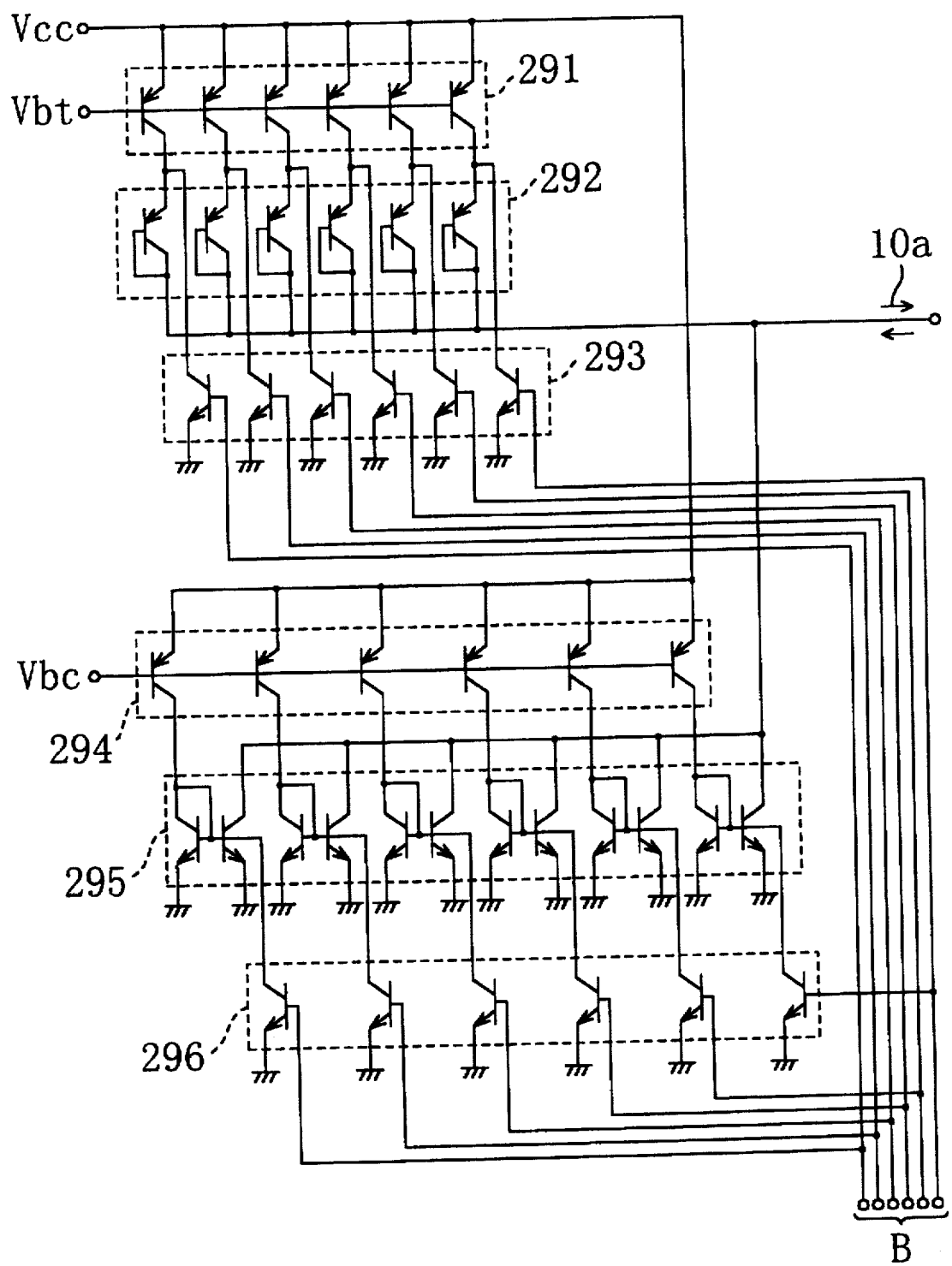
FIG. 15 is a circuit diagram for showing the detailed configuration of a third current supplying circuit of FIG. 11.

FIG. 15 shows the detailed configuration of the third current supplying circuit 290 of FIG. 11. The third current supplying circuit 290 of FIG. 15 comprises, correspondingly to the six bits of the signal B, six PNP transistors 291 sharing the base voltage $V_{bc}$, six PNP transistors 292 for discharging a current, six NPN transistors 293 for switching, six PNP transistors 294 sharing the base voltage $V_{bc}$, twelve NPN transistors 295 together forming six current mirror circuits for absorbing a current, and six NPN transistors 296 for switching. The numbers of the on-transistors among the six NPN transistors 293 and among the six NPN transistors 296 are changed in response to the signal B of six bits, the output current of the current source 10a is varied in accordance with the changed numbers of the on-transistors.

Figure 16:
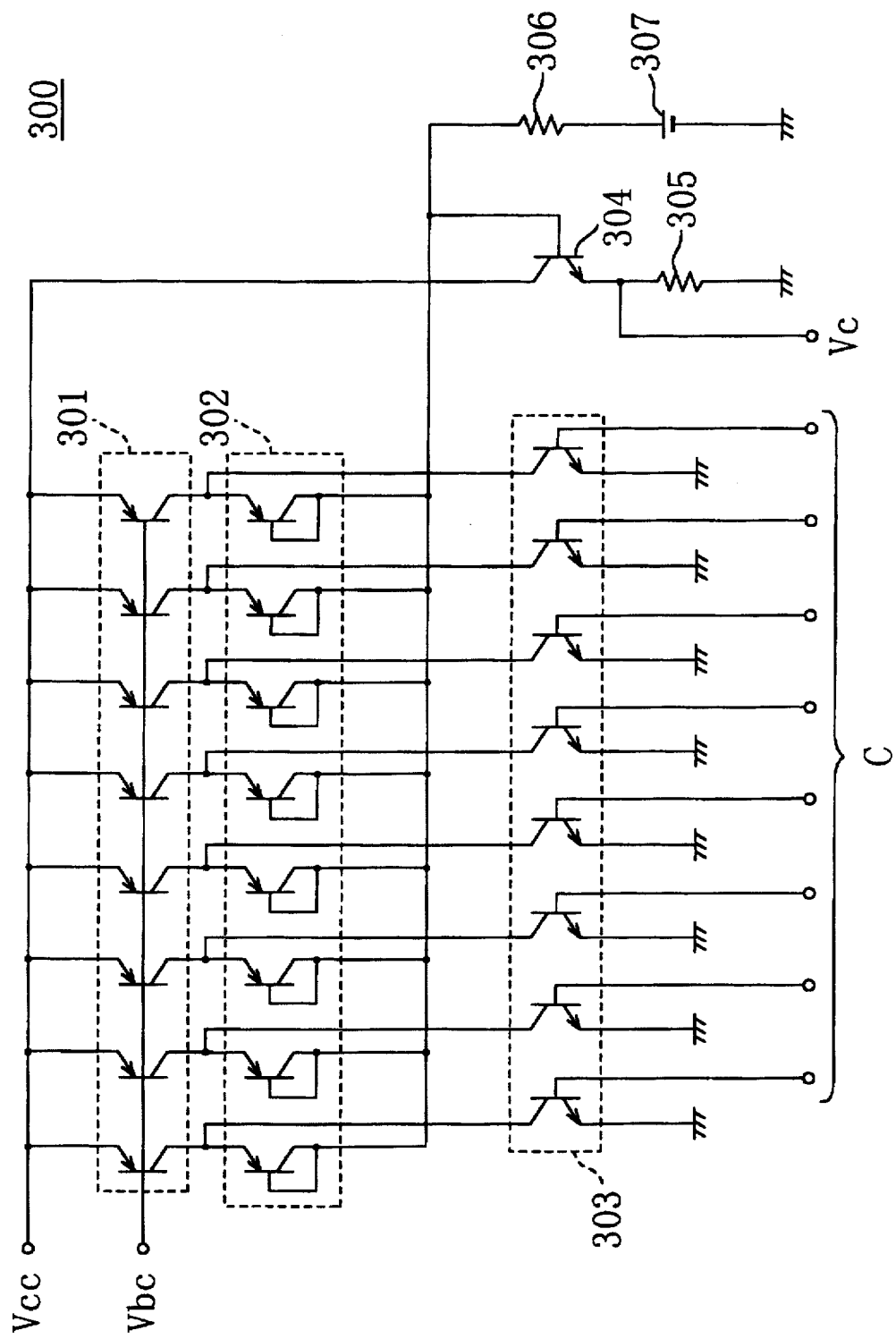
FIG. 16 is a circuit diagram for showing the detailed configuration of a zero-order function generator of FIG. 10.

FIG. 16 shows the detailed configuration of the zero-order function generator 300 of FIG. 10. The zero-order function generator 300 of FIG. 16 comprises a current source including, correspondingly to the eight bits of the signal C, eight PNP transistors 301 sharing the base voltage $V_{bc}$, eight PNP transistors 302 for discharging a current, and eight NPN transistors 303 for switching. The zero-order function generator 300 of FIG. 16 further comprises an NPN transistor 304 for supplying a constant voltage $V_c$ regardless of the ambient temperature $T_a$, two resistors 305 and 306, and a constant voltage supply 307. When the number of the on-transistors among the eight NPN transistors 303 is changed in response to the signal C of eight bits, the voltage $V_c$ is varied in accordance with the changed number of the on-transistors.

Figure 17:
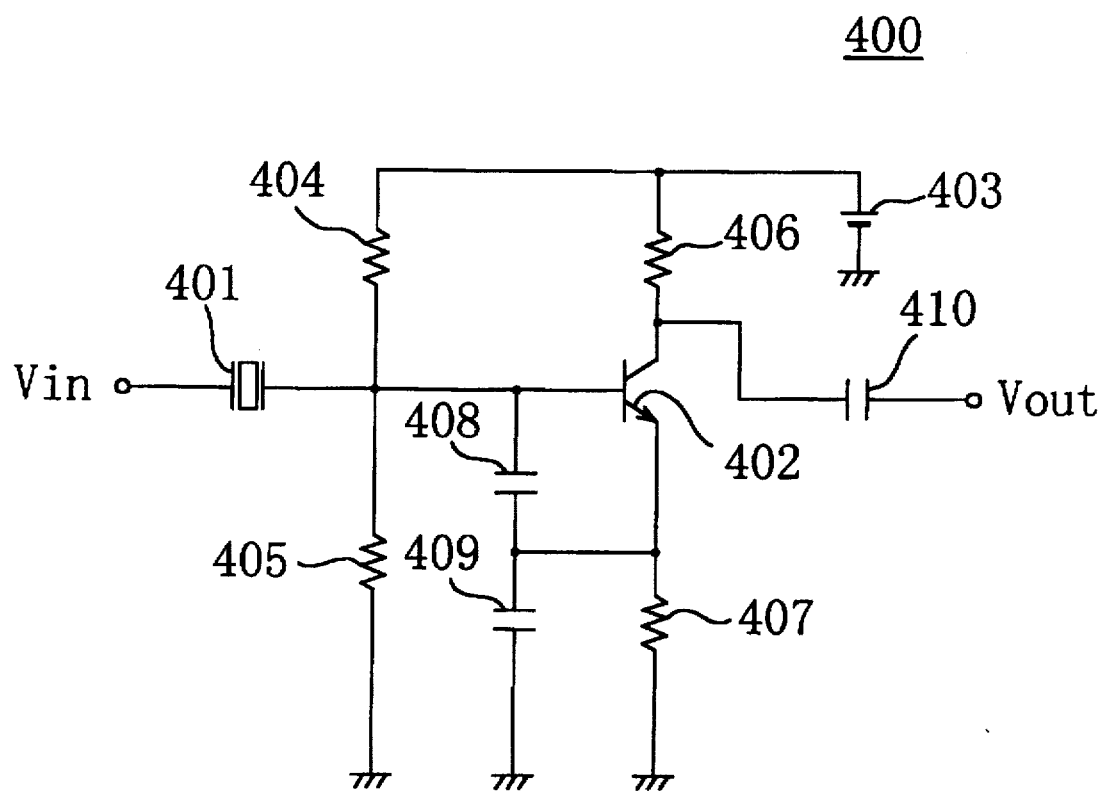
FIG. 17 is a circuit diagram for showing the detailed configuration of a crystal oscillating circuit of FIG. 10.

FIG. 17 shows the detailed configuration of the crystal oscillating circuit 400 of FIG. 10. The crystal oscillating circuit 400 of FIG. 17 is a Colpitts crystal oscillating circuit, and includes a crystal resonator 401, an NPN transistor 402, a constant voltage supply 403, four resistors 404, 405, 406 and 407, two capacitors 408 and 409, and one coupling capacitor 410. Although an output voltage $V_{Out}$ is output from the collector of the NPN transistor 402 in FIG. 17, the output voltage $V_{Out}$ can be output from the emitter of the NPN transistor 402.

The temperature-compensated crystal oscillator described referring to FIGS. 10 through 17 can realize highly accurate temperature compensation of a crystal oscillation frequency without using a programmable ROM with a large capacity and a D/A converter with a high resolution.

What is claimed is:

1. A function generator for generating a current in proportion to a power of a difference between an ambient temperature and a reference temperature, comprising:

a first diode series including a first series circuit of a first number of diodes, wherein a voltage at a first terminal of said first series circuit is fixed at a reference voltage;

a first current source connected with a second terminal of said first series circuit so that a constant current flows into said first diode series unaffected by the ambient temperature;

a second diode series including a second series circuit of a second number of diodes, said second number is larger than said first number, wherein a voltage at a first terminal of said second series circuit is fixed at the reference voltage;

a second current source connected with a second terminal of said second series circuit so that a current flows into said second diode series in proportion to the difference in temperature between the ambient temperature and the reference temperature;

an output terminal for outputting a current;

an output transistor of which collector is connected with said output terminal; and voltage supply means for supplying a differential voltage to the base and the emitter of said output transistor given by a voltage at said second terminal of said first series circuit and a voltage at said second terminal of said second series circuit.

2. The function generator of claim 1, wherein the voltage at said first terminal of said first series circuit and the voltage at said first terminal of said second series circuit are respectively fixed at a ground voltage; and said first and second current sources supply currents so that the currents flow into said first and second diode series, respectively.

3. The function generator of claim 1, wherein the voltage at said first terminal of said first series circuit and the voltage at said first terminal of said second series circuit are respectively fixed at a supply voltage; and said first and second current sources absorb currents so that the currents flow from said first and second diode series, respectively.

4. The function generator of claim 1, wherein said first number of the diodes included in said first series circuit is set at two, and said second number of the diodes included in said second series circuit is set at three.

5. The function generator of claim 1, wherein said output transistor is composed of an NPN transistor; and said voltage supply means includes:

means for supplying a higher voltage to the base of said NPN transistor, on the basis of a ground voltage, compared the voltage at said second terminal of said first series circuit with the voltage at said second terminal of said second series circuit; and an operational amplifier working as a voltage follower for supplying a voltage equal to a lower voltage to the emitter of said NPN transistor, on the basis of the ground voltage, compared the voltage at said second terminal of said first series circuit with the voltage at said second terminal of said second series circuit.

6. The function generator of claim 1, wherein said output transistor is composed of a PNP transistor, and said voltage supply means includes:

means for supplying a lower voltage to the base of said PNP transistor, on the basis of a ground voltage, compared the voltage at said second terminal of said first series circuit with at said second terminal of said second series circuit; and an operational amplifier working as a voltage follower for supplying a voltage equal to a higher voltage to the emitter of said PNP transistor, on the basis of the ground voltage, compared the voltage at said second terminal of said first series circuit with at said second terminal of said second series circuit.

7. The function generator of claim 1, wherein said output transistor is a composite of transistors composed of first and second transistors of the same type, wherein the collector of said first transistor being connected with said output terminal, the emitter of said second transistor being connected with the base of said first transistor; and a voltage at the collector of said second transistor is fixed at the reference voltage.

8. The function generator of claim 7 further comprising means for allowing a current flow equal to a current flowing in said first diode series through the emitter of said second transistor.

9. A function generator for generating a current in proportion to the cube of a difference in temperature between an ambient temperature and a reference temperature, comprising:

a first diode series including a first series circuit of two diodes, wherein a voltage at a first terminal of said first series circuit is fixed at a ground voltage;

a first current source for supplying a current to a second terminal of said first series circuit so that a constant current flows into said first diode series unaffected by the ambient temperature;

a second diode series including a second series circuit of three diodes, wherein a voltage at a first terminal of said second series circuit being fixed at the ground voltage;

a second current source for supplying a current to a second terminal of said second series circuit so that a current flows into said second diode series in proportion to the difference in temperature between the ambient temperature and the reference temperature;

a third diode series including a third series circuit of two diodes, wherein a voltage at a first terminal of said third series circuit is fixed at a supply voltage;

a third current source for absorbing a current from a second terminal of said third series circuit so that a constant current flows from said third diode series unaffected by the ambient temperature;

a fourth diode series including a fourth series circuit of three diodes, wherein a voltage at a first terminal of said fourth series circuit is fixed at the supply voltage;

a fourth current source for absorbing a current from a second terminal of said fourth series circuit so that a current flows from said fourth diode series in proportion to the difference between the ambient temperature and the reference temperature;

an output terminal for outputting a current;

an output NPN transistor and an output PNP transistor of which-collectors are respectively connected with said output terminal;

first voltage supply means for supplying a differential voltage given by a voltage at said second terminal of said first series circuit and a voltage at said second terminal of said second series circuit to the base and the emitter of said output NPN transistor, so that a current is absorbed through said output terminal to the collector of said output NPN transistor; and second voltage supply means for supplying a differential voltage given by a voltage at said second terminal of said third series circuit and a voltage at said second terminal of said fourth series circuit to the base and the emitter of said output PNP transistor, so that a current is supplied to said output terminal through the collector of said output PNP transistor.

10. The function generator of claim 9, wherein said second current source has a function to cut current flow flowing to said second diodes series when the ambient temperature is equal to or lower than the reference temperature and has a function to supply a current to said second diode series said current increases as the ambient temperature increases when the ambient temperature is higher than the reference temperature, and said fourth current source has a function to cut current flow from said fourth diode series when the ambient temperature is equal to or higher than the reference temperature, and to absorb a current from said fourth diode series which increases as the ambient temperature decreases when the ambient temperature is lower than the reference temperature.

11. The function generator of claim 9, wherein said second and fourth series circuits are connected with a common node through said second terminals thereof, and said second and fourth current sources connected with said common node are constituted by a common current source for supplying a current to said common node in proportion to the difference in temperature between the ambient temperature and the reference temperature when the ambient temperature is equal to or higher than the reference temperature, and for absorbing a current from said common node in proportion to the difference in temperature between the ambient temperature and the reference temperature when the ambient temperature is lower than the reference temperature.

12. The function generator of claim 9, wherein said second current source has a function to cut current flow into said second diode series when the ambient temperature is equal to or higher than the reference temperature, and to supply a current to said second diode series which increases as the ambient temperature decreases when the ambient temperature is lower than the reference temperature, and said fourth current source has a function to cut current flow from said fourth diode series when the ambient temperature is equal to or lower than the reference temperature, and to absorb a current from said fourth diode series which increases as the ambient temperature increases when the ambient temperature is higher than the reference temperature.

13. The function generator of claim 9, wherein said second and fourth series circuits are connected with a common node through said second terminals thereof, and said second and fourth current sources connected with said common node are constituted by a common current source for absorbing a current from said common node in proportion to the difference in temperature between the ambient temperature and the reference temperature when the ambient temperature is equal to or higher than the reference temperature, and for supplying a current to said common node in proportion to the difference in temperature between the ambient temperature and the reference temperature when the ambient temperature is lower than the reference temperature.

14. A function generator for generating a voltage for attaining temperature compensation of an oscillation frequency of a crystal oscillator represented by a cubic function of a difference in temperature between an ambient temperature and a reference temperature, comprising:

a first circuit for outputting a current in proportion to the difference in temperature between the ambient temperature and the reference temperature;

a second circuit having an output terminal for outputting a current through said output terminal in proportion to the cube of the difference in temperature between the ambient temperature and the reference temperature;

a third circuit for generating a constant voltage unaffected by the ambient temperature; and means for converting a sum of an output current of said first circuit and an output current of said second circuit into a voltage, and supplying a sum of said voltage obtained through conversion and an output voltage of said third circuit for the temperature compensation voltage;

wherein said second circuit includes:

a first diode series including a first series circuit of two diodes, wherein a voltage at a first terminal of said first series circuit being fixed at a ground voltage;

a first current source for supplying a current to a second terminal of said first series circuit so that a constant current flows into said first diode series unaffected by the ambient temperature;

a second diode series including a second series circuit of three diodes, wherein a voltage at a first terminal of said second series circuit is fixed at the ground voltage;

a second current source for supplying a current to a second terminal of said second series circuit so that a current flows into said second diode series in proportion to the difference in temperature between the ambient temperature and the reference temperature;

a third diode series including a third series circuit of two-diodes, wherein a voltage at a first terminal of said third series circuit being fixed at a supply voltage;

a third current source for absorbing a current from a second terminal of said third series circuit so that a constant current flows from said third diode series unaffected by the ambient temperature;

a fourth diode series including a fourth series circuit of three diodes, wherein a voltage at a first terminal of said fourth series circuit being fixed at the supply voltage;

a fourth current source for absorbing a current from a second terminal of said fourth series circuit so that a current flows from said fourth diode series in proportion to the difference between the ambient temperature and the reference temperature;

an output NPN transistor and an output PNP transistor of which collectors are respectively connected with said output terminal;

first voltage supply means for supplying a differential voltage given by a voltage at said second terminal of said first series circuit and a voltage at said second terminal of said second series circuit to the base and the emitter of said output NPN transistor so that a current is absorbed from said output terminal to the collector of said output NPN transistor; and second voltage supply means for supplying a differential voltage given by a voltage at said second terminal of said third series circuit and a voltage at said second terminal of said fourth series circuit to the base and the emitter of said output PNP transistor so that a current is supplied to said output terminal through the collector of said output PNP transistor.

15. The function generator of claim 14, wherein said second and fourth series circuits are connected with a common node through said second terminals thereof, and said second and fourth current sources connected with said common node are constituted by a common current source for supplying a current to said common node in proportion to the difference in temperature between the ambient temperature and the reference temperature when the ambient temperature is equal to or higher than the reference temperature, and for absorbing a current from said common node in proportion to the difference in temperature between the ambient temperature and the reference temperature when the ambient temperature is lower than the reference temperature.

16. The function generator of claim 14 further comprising a controller for setting the reference temperature and constants of the third power, the first power and the zeroth power of the difference in temperature between the ambient temperature and the reference temperature for defining said cubic function.

* * * * *

UNITED STATES PATENT AND TRADEMARK OFFICE
CERTIFICATE OF CORRECTION

PATENT NO. : 5,719,533
DATED : February 17, 1998
INVENTOR(S) : Shuji SHIBUYA et al.

It is certified that error appears in the above-indentified patent and that said Letters Patent is hereby corrected as shown below:

Cover Page, Line 7, [73] Assignee, Change Matsushita Electric Industrial Col., Ltd. to --Matsushita Electric Industrial Co., Ltd.--

Col. 16, Line 47, Delete "which-collectors" and insert --which collectors--

Col. 18, Line 31, Delete "two-diodes" and insert --two diodes--

Signed and Sealed this

Sixth Day of October, 1998

Attest:

BRUCE LEHMAN

Attesting Officer

Commissioner of Patents and Trademarks